(12) United States Patent  
Roberts et al.

(10) Patent No.: US 8,998,444 B2
(45) Date of Patent: Apr. 7, 2015

(54) SOLID STATE LIGHTING DEVICES INCLUDING LIGHT MIXTURES

(75) Inventors: John Roberts, Grand Rapids, MI (US); Gerald H. Negley, Chapel Hill, NC (US); Antony P. van de Ven, Sai Kung (HK); Arpan Chakraborty, Goleta, CA (US); Bernd Keller, Santa Barbara, CA (US); Ronan P. Le Toquin, Ventura, CA (US)

(73) Assignee: Cree, Inc., Durham, NC (US)

( * ) Notice: Subject to any disclaimer, the term of this patent is extended or adjusted under 35 U.S.C. 154(b) by 1186 days.

(21) Appl. No.: 12/491,654

(22) Filed: Jun. 25, 2009

(65) Prior Publication Data

US 2010/0079059 A1 Apr. 1, 2010

Related U.S. Application Data

(63) Continuation-in-part of application No. 11/736,761, filed on Apr. 18, 2007, now Pat. No. 8,513,875, and a continuation-in-part of application No. 11/948,021, filed on Nov. 30, 2007.

(Continued)

(51) Int. Cl.
*F21V 9/00* (2006.01)
*F21K 99/00* (2010.01)
*F21S 4/00* (2006.01)

(Continued)

(52) U.S. Cl.
CPC .. *F21K 9/00* (2013.01); *F21S 4/003* (2013.01); *F21Y 2101/02* (2013.01); *F21Y 2105/003* (2013.01); *H01L 25/0753* (2013.01); *H01L 33/50* (2013.01); *F21Y 2103/003* (2013.01); *H01L 2924/0002* (2013.01); *Y10S 362/80* (2013.01)

(58) Field of Classification Search
USPC .............. 362/231, 235, 800, 84; 313/503
See application file for complete search history.

(56) References Cited

U.S. PATENT DOCUMENTS 4,120,026 A 10/1978 Tsuchihashi et al.
4,710,699 A 12/1987 Miyamoto (Continued)

FOREIGN PATENT DOCUMENTS

DE 39 16 875 12/1990
DE 042 28 895 3/1994

(Continued)

OTHER PUBLICATIONS

U.S. Appl. No. 60/792,859, filed Apr. 18, 2006, Van De Ven.

(Continued)

*Primary Examiner* — Anh Mai
*Assistant Examiner* — Jessica M Apenteng
(74) *Attorney, Agent, or Firm* — Myers Bigel Sibley & Sajovec, P.A.

(57) ABSTRACT

A solid state lighting apparatus includes a plurality of light emitting diodes (LEDs) including at least a first LED and a second LED. Chromaticities of the first and second LEDs are selected so that a combined light generated by a mixture of light from the pair of LEDs has about a target chromaticity. The first LED may include a first LED chip that emits light in the blue portion of the visible spectrum and a phosphor that emits red light in response to blue light emitted by the first LED chip. The second LED emits light having a color point that is above the planckian locus of a 1931 CIE Chromaticity diagram, and in particular may have a yellow green, greenish yellow or green hue.

28 Claims, 13 Drawing Sheets

Related U.S. Application Data

(60) Provisional application No. 60/792,859, filed on Apr. 18, 2006, provisional application No. 60/793,524, filed on Apr. 20, 2006, provisional application No. 60/868,134, filed on Dec. 1, 2006, provisional application No. 61/075,513, filed on Jun. 25, 2008.

(51) Int. Cl.
  *F21Y 101/02* (2006.01)
  *F21Y 105/00* (2006.01)
  *H01L 25/075* (2006.01)
  *H01L 33/50* (2010.01)
  *F21Y 103/00* (2006.01)

(56) References Cited

U.S. PATENT DOCUMENTS

| | | | |
|---|---|---|---|
| 5,477,436 A | 12/1995 | Bertling et al. | |
| 5,803,579 A | 9/1998 | Turnbull et al. | |
| 5,851,063 A | 12/1998 | Doughty et al. | |
| 6,132,072 A | 10/2000 | Turnbull et al. | |
| 6,153,971 A | 11/2000 | Shimizu | |
| 6,212,213 B1 | 4/2001 | Weber et al. | |
| 6,234,648 B1 | 5/2001 | Borner et al. | |
| 6,319,425 B1 | 11/2001 | Tasaki et al. | |
| 6,337,536 B1 | 1/2002 | Matsubara et al. | |
| 6,373,188 B1 | 4/2002 | Johnson et al. | |
| 6,441,558 B1 | 8/2002 | Muthu et al. | |
| 6,480,299 B1 | 11/2002 | Drakopoulos et al. | |
| 6,513,949 B1 | 2/2003 | Marshall et al. | |
| 6,538,371 B1 | 3/2003 | Duggal et al. | |
| 6,547,249 B2 | 4/2003 | Collins, III et al. | |
| 6,550,949 B1 | 4/2003 | Bauer et al. | |
| 6,552,495 B1 | 4/2003 | Chang | |
| 6,577,073 B2 | 6/2003 | Shimizu et al. | |
| 6,600,175 B1 | 7/2003 | Baretz et al. | |
| 6,600,324 B2 | 7/2003 | St. Germain | |
| 6,616,862 B2 | 9/2003 | Srivastava et al. | |
| 6,624,638 B2 | 9/2003 | St. Germain | |
| 6,635,503 B2 | 10/2003 | Andrews et al. | |
| 6,636,003 B2 | 10/2003 | Rahm et al. | |
| 6,642,666 B1 | 11/2003 | St. Germain | |
| 6,685,852 B2 | 2/2004 | Setlur et al. | |
| 6,692,136 B2 | 2/2004 | Marshall et al. | |
| 6,703,173 B2 | 3/2004 | Lu et al. | |
| 6,737,801 B2 | 5/2004 | Ragle | |
| 6,744,194 B2 | 6/2004 | Fukasawa et al. | |
| 6,762,563 B2 | 7/2004 | St. Germain et al. | |
| 6,784,463 B2 | 8/2004 | Camras et al. | |
| 6,817,735 B2 | 11/2004 | Shimizu et al. | |
| 6,841,804 B1 | 1/2005 | Chen et al. | |
| 6,853,010 B2 | 2/2005 | Slater, Jr. et al. | |
| 6,882,101 B2 | 4/2005 | Ragle | |
| 6,885,035 B2 | 4/2005 | Bhat et al. | |
| 6,914,267 B2 | 7/2005 | Fukasawa et al. | |
| 6,936,857 B2 | 8/2005 | Doxsee et al. | |
| 6,957,899 B2 | 10/2005 | Jiang et al. | |
| 6,967,116 B2 | 11/2005 | Negley | |
| 7,005,679 B2 | 2/2006 | Tarsa et al. | |
| 7,008,078 B2 | 3/2006 | Shimizu et al. | |
| 7,009,199 B2 | 3/2006 | Hall | |
| 7,009,343 B2 | 3/2006 | Lim et al. | |
| 7,014,336 B1 | 3/2006 | Ducharme et al. | |
| 7,023,019 B2 | 4/2006 | Maeda et al. | |
| 7,066,623 B2 | 6/2006 | Lee et al. | |
| 7,095,056 B2 | 8/2006 | Vitta et al. | |
| 7,125,143 B2 | 10/2006 | Hacker | |
| 7,135,664 B2 | 11/2006 | Vornsand et al. | |
| 7,141,442 B2 | 11/2006 | Sano | |
| 7,207,691 B2 | 4/2007 | Lee et al. | |
| 7,213,940 B1 | 5/2007 | Van De Ven et al. | |
| 7,213,942 B2 | 5/2007 | Jiang et al. | |
| 7,217,583 B2 | 5/2007 | Negley et al. | |
| 7,221,044 B2 | 5/2007 | Fan et al. | |
| 7,250,715 B2 | 7/2007 | Mueller et al. | |
| 7,256,557 B2 | 8/2007 | Lim et al. | |
| 7,262,439 B2 | 8/2007 | Radkov | |
| 7,278,760 B2 | 10/2007 | Heuser et al. | |
| 7,358,954 B2 | 4/2008 | Negley et al. | |
| 7,365,485 B2 | 4/2008 | Fukasawa et al. | |
| 7,387,405 B2 | 6/2008 | Ducharme et al. | |
| 7,417,259 B2 | 8/2008 | Sakai et al. | |
| 7,422,504 B2 | 9/2008 | Maeda et al. | |
| 7,453,195 B2 | 11/2008 | Radkov | |
| 7,473,934 B2 | 1/2009 | Nagai et al. | |
| 7,564,180 B2 | 7/2009 | Brandes | |
| 2003/0030063 A1 | 2/2003 | Sosniak et al. | |
| 2003/0042908 A1 | 3/2003 | St. Germain | |
| 2003/0089918 A1 | 5/2003 | Hiller et al. | |
| 2004/0046178 A1 | 3/2004 | Sano | |
| 2004/0105264 A1 | 6/2004 | Spero | |
| 2004/0264193 A1 | 12/2004 | Okumura | |
| 2005/0030744 A1 | 2/2005 | Ducharme et al. | |
| 2005/0052378 A1* | 3/2005 | Hacker | 345/84 |
| 2006/0012989 A1 | 1/2006 | Lee | |
| 2006/0022582 A1 | 2/2006 | Radkov | |
| 2006/0067073 A1* | 3/2006 | Ting | 362/231 |
| 2006/0097245 A1* | 5/2006 | Aanegola et al. | 257/26 |
| 2006/0105482 A1 | 5/2006 | Alferink et al. | |
| 2006/0113548 A1 | 6/2006 | Chen et al. | |
| 2006/0138435 A1 | 6/2006 | Tarsa et al. | |
| 2006/0181192 A1 | 8/2006 | Radkov et al. | |
| 2006/0245184 A1 | 11/2006 | Galli | |
| 2007/0001188 A1 | 1/2007 | Lee | |
| 2007/0051966 A1 | 3/2007 | Hagashi et al. | |
| 2007/0090381 A1 | 4/2007 | Otsuka et al. | |
| 2007/0139920 A1 | 6/2007 | Van De Ven et al. | |
| 2007/0139923 A1 | 6/2007 | Negley et al. | |
| 2007/0170447 A1 | 7/2007 | Negley et al. | |
| 2007/0171145 A1 | 7/2007 | Coleman et al. | |
| 2007/0202623 A1 | 8/2007 | Gao et al. | |
| 2007/0223219 A1 | 9/2007 | Medendorp, Jr. et al. | |
| 2007/0236911 A1 | 10/2007 | Negley | |
| 2007/0263393 A1 | 11/2007 | Van De Ven | |
| 2007/0267983 A1 | 11/2007 | Van De Ven et al. | |
| 2007/0274063 A1 | 11/2007 | Negley | |
| 2007/0274080 A1 | 11/2007 | Negley et al. | |
| 2007/0276606 A1 | 11/2007 | Radkov et al. | |
| 2007/0278503 A1 | 12/2007 | Van De Ven et al. | |
| 2007/0278934 A1 | 12/2007 | Van De Ven et al. | |
| 2007/0279440 A1 | 12/2007 | Negley | |
| 2007/0279903 A1 | 12/2007 | Negley et al. | |
| 2007/0280624 A1 | 12/2007 | Negley et al. | |
| 2008/0084685 A1 | 4/2008 | Van De Ven et al. | |
| 2008/0084700 A1 | 4/2008 | Van De Ven | |
| 2008/0084701 A1 | 4/2008 | Van De Ven et al. | |
| 2008/0088248 A1 | 4/2008 | Myers | |
| 2008/0089053 A1 | 4/2008 | Negley | |
| 2008/0101064 A1* | 5/2008 | Draganov et al. | 362/231 |
| 2008/0106895 A1 | 5/2008 | Van De Ven et al. | |
| 2008/0106907 A1 | 5/2008 | Trott et al. | |
| 2008/0112168 A1 | 5/2008 | Pickard et al. | |
| 2008/0112170 A1 | 5/2008 | Trott et al. | |
| 2008/0112183 A1 | 5/2008 | Negley | |
| 2008/0130265 A1 | 6/2008 | Negley et al. | |
| 2008/0130285 A1 | 6/2008 | Negley et al. | |
| 2008/0130298 A1 | 6/2008 | Negley et al. | |
| 2008/0136313 A1 | 6/2008 | Van De Ven et al. | |
| 2008/0137347 A1 | 6/2008 | Trott et al. | |
| 2008/0179602 A1 | 7/2008 | Negley et al. | |
| 2008/0211416 A1 | 9/2008 | Negley et al. | |
| 2008/0259589 A1 | 10/2008 | Van De Ven | |
| 2008/0278928 A1 | 11/2008 | Van De Ven et al. | |
| 2008/0278940 A1 | 11/2008 | Van De Ven et al. | |
| 2008/0278950 A1 | 11/2008 | Pickard et al. | |
| 2008/0278952 A1 | 11/2008 | Trott et al. | |
| 2008/0304260 A1 | 12/2008 | Van De Ven et al. | |
| 2008/0304261 A1 | 12/2008 | Van De Ven et al. | |
| 2008/0304269 A1 | 12/2008 | Pickard et al. | |
| 2008/0309255 A1 | 12/2008 | Myers et al. | |
| 2008/0310154 A1 | 12/2008 | Van De Ven et al. | |
| 2009/0050907 A1 | 2/2009 | Yuan et al. | |
| 2009/0108269 A1 | 4/2009 | Negley et al. | |
| 2009/0160363 A1 | 6/2009 | Negley et al. | |

(56) References Cited

U.S. PATENT DOCUMENTS

| | | | |
|---|---|---|---|
| 2009/0161356 | A1 | 6/2009 | Negley et al. |
| 2009/0184616 | A1 | 7/2009 | Van De Ven et al. |
| 2009/0184666 | A1 | 7/2009 | Myers et al. |
| 2009/0246895 | A1 | 10/2009 | You et al. |
| 2010/0025700 | A1* | 2/2010 | Jung et al. ............... 257/89 |

FOREIGN PATENT DOCUMENTS

| | | |
|---|---|---|
| DE | 103 35 077 | 3/2005 |
| EP | 0 838 866 | 4/1998 |
| EP | 0 971 421 A2 | 1/2000 |
| EP | 1 024 399 A1 | 8/2000 |
| EP | 1 160 883 A2 | 12/2001 |
| EP | 1 193 772 A2 | 4/2002 |
| EP | 1 367 655 A1 | 12/2003 |
| EP | 1 462 711 | 12/2004 |
| EP | 1 566 848 | 8/2005 |
| EP | 1 850 383 | 10/2007 |
| JP | 10-163535 | 6/1998 |
| JP | 2000-183408 | 6/2000 |
| JP | 2000-294834 | 10/2000 |
| JP | 2000-294834 A | 10/2000 |
| JP | 2001 156331 | 6/2001 |
| JP | 2001/307506 | 11/2001 |
| JP | 2001-320094 A | 11/2001 |
| JP | 2002-150821 | 5/2002 |
| JP | 2003-515956 | 5/2003 |
| JP | 2003-529889 | 10/2003 |
| JP | 2004-080046 | 3/2004 |
| JP | 2004-103443 | 4/2004 |
| JP | 2004-253309 | 9/2004 |
| JP | 2004-356116 | 12/2004 |
| JP | 2004-363055 | 12/2004 |
| JP | 2005-079500 A | 3/2005 |
| JP | 2005-142311 | 6/2005 |
| JP | 2005-244075 A | 9/2005 |
| JP | 2006-245443 A | 9/2006 |
| JP | 2007-122950 | 5/2007 |
| JP | 2007-141737 | 6/2007 |
| JP | 2008-034188 A | 2/2008 |
| WO | WO 00/19546 | 4/2000 |
| WO | WO 01/41215 | 6/2001 |
| WO | WO 01/41215 A1 | 6/2001 |
| WO | WO 2005/004202 A2 | 1/2005 |
| WO | WO 2005/013365 | 2/2005 |
| WO | WO 2005/022030 | 3/2005 |
| WO | WO 2005/124877 | 12/2005 |
| WO | WO 2006/003559 | 1/2006 |
| WO | WO 2006/028312 | 3/2006 |
| WO | WO 2006/061728 A2 | 6/2006 |
| WO | WO 2008/070541 A1 | 6/2008 |

OTHER PUBLICATIONS

U.S. Appl. No. 60/793,524, filed Apr. 20, 2006, Van De Ven.
U.S. Appl. No. 60/868,134, filed Dec. 1, 2006, Van De Ven.
U.S. Appl. No. 60/978,880, filed Oct. 10, 2007, Van De Ven.
U.S. Appl. No. 60/990,435, filed Nov. 27, 2007, Van De Ven.
U.S. Appl. No. 60/990,439, filed Nov. 27, 2007, Negley.
U.S. Appl. No. 60/990,724, filed Nov. 28, 2007, Negley.
U.S. Appl. No. 61/022,886, filed Jan. 23, 2008, Myers.
U.S. Appl. No. 61/037,365, filed Mar. 18, 2008, Van De Ven.
U.S. Appl. No. 61/039,926, filed Mar. 27, 2008, Myers.
U.S. Appl. No. 61/041,404, filed Apr. 1, 2008, Negley.
U.S. Appl. No. 61/075,513, filed Jun. 25, 2008, Roberts.
"Cree XLamp XR-E and XR-C LED Binning and Labeling", pp. 1-15, Copyright 2007-2008 Cree, Inc. Application Note: CLD-AP12. 008.
Cree® XLamp® 7090 XR-E Series LED Binning and Labeling.
International Search Report and Written Opinion corresponding to International Application No. PCT/US2007/009462; Mailing Date: Oct. 24, 2008.
International Search Report and Written Opinion corresponding to International Application No. PCT/US2007/009459; Mailing Date: Mar. 3, 2008.
International Search Report and Written Opinion corresponding to International Application No. PCT/US2008/054665; Mailing Date: Jul. 16, 2008.
International Search Report and Written Opinion corresponding to International Application No. PCT/US2007/086593; Mailing Date: Apr. 18, 2008.
International Search Report and Written Opinion corresponding to International Application No. PCT/US2006/048654; Mailing Date: Feb. 13, 2008.
International Search Report and Written Opinion corresponding to International Application No. PCT/US2008/063042; Mailing Date: Jul. 21, 2008.
International Search Report and Written Opinion corresponding to International Application No. PCT/US2007/086027; Mailing Date: Apr. 25, 2008.
International Search Report and Written Opinion corresponding to International Application No. PCT/US2008/063021; Mailing Date: Aug. 5, 2008.
International Search Report and Written Opinion corresponding to International Application No. PCT/US2008/051633; Mailing Date: Aug. 14, 2008.
International Search Report and Written Opinion corresponding to International Application No. PCT/US2008/063016; Mailing Date: Aug. 5, 2008.
International Search Report and Written Opinion corresponding to International Application No. PCT/US2008/063027; Mailing Date: Jul. 23, 2008.
International Search Report and Written Opinion corresponding to International Application No. PCT/US2007/09629; Mailing Date: Feb. 11, 2008.
International Search Report and Written Opinion corresponding to International Application No. PCT/US2008/079299; Mailing Date: Jan. 9, 2009.
International Search Report and Written Opinion corresponding to International Application No. PCT/US2008/063020; Mailing Date: Jul. 21, 2008.
International Search Report and Written Opinion corresponding to International Application No. PCT/US2009/003768; Mailing Date: Sep. 24, 2009.
Krames, "Lumileds Lighting, Light from Silicon Valley" Progress and Future Direction of LED Technology, SSL Workshop, 13 Nov. 2003, pp. 1-21.
"LED Binning" Cree LED Light, pp. 1-12 (2007).
Mirhosseini, et al. "Improved Color Rendering and Luminous Efficacy in Phosphor-Converted White Light-Emitting Diodes by Use of Dual-Blue Emitting Active Regions" Optical Society of America 17(13):10806-10813 (2009).
Ohno, "Simulation Analysis of White LED Spectra and Color Rendering" National Institute of Standards and Technology, USA, pp. 1-4.
"Specifications for the Chromaticity of Solid State Lighting Products" American National Standard Lighting Group, ANSI_NEMA_ANSLG C78.377-2008, pp. 1-17 (Jan. 9, 2008).
Van de Ven et al., "Warm White Illumination with High CRI and High Efficacy by Combining 455 nm Excited Yellowish Phosphor LEDs and Red AlInGaP LEDs", First International Conference on White LEDs and Solid State Lighting.
Japanese Office Action Corresponding to Japanese Patent Application No. 2011-516301; Mailing Date: Oct. 26, 2012; 4 Pages.
Japanese Office Action Corresponding to Japanese Patent Application No. 2011-516301; Mailing Date: Sep. 3, 2013; Foreign Text, 4 Pages, English Translation Thereof, 3 Pages.
Communication pursuant to Article 94(3) EPC, European Patent Application No. 09 770 537.0, Dec. 6, 2013, 5 pages.

* cited by examiner

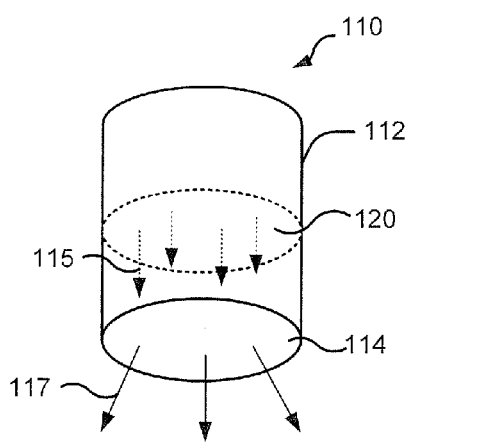 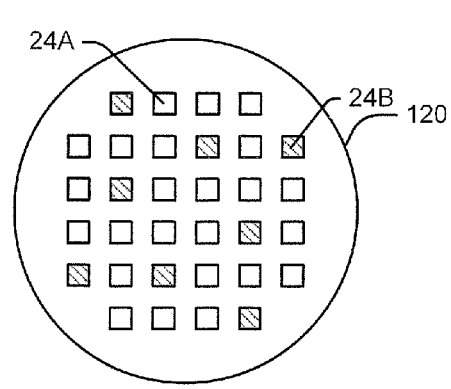
FIGURE 10A  FIGURE 10B
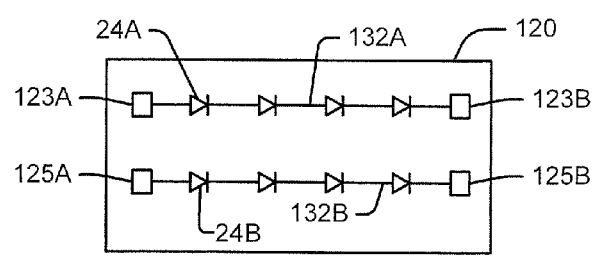
FIGURE 11

SOLID STATE LIGHTING DEVICES INCLUDING LIGHT MIXTURES

CROSS REFERENCE TO RELATED APPLICATIONS

The present application claims the benefit of and priority to U.S. Provisional Patent Application No. 61/075,513, filed Jun. 25, 2008, entitled "SOLID STATE LIGHTING DEVICES AND METHODS" (inventor: John Roberts). The present application is a continuation in part of U.S. patent application Ser. No. 11/736,761, filed Apr. 18, 2007 now U.S. Pat. No. 8,513,875, entitled "LIGHTING DEVICE AND LIGHTING METHOD," which claims the benefit of U.S. Provisional Patent Application No. 60/792,859, filed on Apr. 18, 2006, entitled "LIGHTING DEVICE AND LIGHTING METHOD" (inventors: Gerald H. Negley and Antony Paul van de Ven), U.S. Provisional Patent Application No. 60/793,524, filed on Apr. 20, 2006, entitled "LIGHTING DEVICE AND LIGHTING METHOD" (inventors: Gerald H. Negley and Antony Paul van de Ven) and U.S. Provisional Patent Application No. 60/868,134, filed on Dec. 1, 2006, entitled "LIGHTING DEVICE AND LIGHTING METHOD" (inventors: Gerald H. Negley and Antony Paul van de Ven). The present application is a continuation in part of U.S. patent application Ser. No. 11/948,021, filed Nov. 30, 2007, entitled "LIGHTING DEVICE AND LIGHTING METHOD," which claims the benefit of U.S. Provisional Patent Application No. 60/868,134, filed on Dec. 1, 2006, entitled "LIGHTING DEVICE AND LIGHTING METHOD" (inventors: Gerald H. Negley and Antony Paul van de Ven). The disclosures of each of the above-referenced applications are hereby incorporated by reference in their entireties.

FIELD OF THE INVENTION

The present invention relates to solid state lighting, and more particularly to solid state lighting systems for general illumination.

BACKGROUND

Solid state lighting devices are used for a number of lighting applications. For example, solid state lighting panels including arrays of solid state lighting devices have been used as direct illumination sources, for example, in architectural and/or accent lighting. A solid state lighting device may include, for example, a packaged light emitting device (LED) including one or more light emitting diode chips. Inorganic LEDs typically include semiconductor layers forming p-n junctions. Organic LEDs (OLEDs), which include organic light emission layers, are another type of solid state light emitting device. Typically, a solid state light emitting device generates light through the recombination of electronic carriers, i.e. electrons and holes, in a light emitting layer or region. LED chips, or dice, can be mounted in many different ways for many different applications. For example, an LED chip can be mounted on a header and enclosed by an encapsulant for protection, wavelength conversion, focusing, dispersion/scattering, etc. LED chips can also be mounted directly to a submount, such as a PCB, and can be coated directly with a phosphor, such as by electrophoresis or other techniques. Accordingly, as used herein, the term "light emitting diode" or "LED" can refer to an LED chip, including an LED chip coated or otherwise provided with phosphor, or to a packaged device, such as a packaged device that includes an LED chip and that provides electrical contacts, primary optics, heat dissipation, and/or other functional features for the LED chip.

Solid state lighting panels are commonly used as backlights for small liquid crystal display (LCD) display screens, such as LCD display screens used in portable electronic devices. In addition, there has been increased interest in the use of solid state lighting panels for general illumination, such as indoor or outdoor lighting. For such applications, it is generally desired for the lighting device to generate white light having a high color rendering index (CRI), so that objects illuminated by the lighting device will appear to have more natural coloring. In contrast, light that has a low CRI may cause illuminated objects to have a washed out or unnatural appearance.

For larger illumination applications, multiple solid state lighting panels may be connected together, for example, in a one or two dimensional array, to form a lighting system. Unfortunately, however, the hue of white light generated by the lighting system may vary from panel to panel, and/or even from lighting device to lighting device. Such variations may result from a number of factors, including variations of intensity of emission from different LEDs, and/or variations in placement of LEDs in a lighting device and/or on a panel. Accordingly, in order to construct a multi-panel lighting system that produces a consistent hue of white light from panel to panel, it may be desirable to measure the hue and saturation, or chromaticity, of light generated by a large number of panels, and to select a subset of panels having a relatively close chromaticity for use in the multi-panel lighting system. This may result in decreased yields and/or increased inventory costs for a manufacturing process.

Moreover, even if a solid state lighting panel has a consistent, desired hue of light when it is first manufactured, the hue and/or brightness of solid state devices within the panel may vary non-uniformly over time and/or as a result of temperature variations, which may cause the overall color point of a lighting panel made up of the panels to change over time and/or may result in non-uniformity of color across the lighting panel. In addition, a user may wish to change the light output characteristics of a lighting panel in order to provide a desired hue and/or brightness level of the lighting panel.

Solid state lighting sources may have a number of advantages over conventional lighting sources for general illumination. For example, a conventional incandescent spotlight may include a 150 watt lamp projecting light from a 30 square inch aperture. Thus, the source may dissipate about 5 watts of power per square inch. Such sources may have a luminous efficacy of no more than about 10 lumens per watt, which means that in terms of ability to generate light in a given area, such a source may generate about 50 lumens per square inch in a relatively small space.

A conventional incandescent spotlight provides a relatively bright, highly directed source of light. However, an incandescent spotlight may illuminate only a small area. Thus, even though an incandescent spotlight has a relatively high light output, it may not be suitable for general illumination, for example illumination of a room. Thus, when used indoors, spotlights are typically reserved for accent or fill-in lighting applications.

Fluorescent light bulbs, on the other hand, produce light in a manner that is more suitable for general illumination. Fluorescent light bulbs approximate line sources of light, for which the illuminance falls off in proportion to 1/r near the source, where r is the distance from the source. Furthermore, fluorescent light sources are typically grouped in a panel to approximate a plane source of light, which may be more useful for general illumination and/or other purposes, since the intensity of the light generated by a plane source may not drop off as quickly near the source as the intensity of a point or line source of light does.

The distributed nature of a fluorescent light panel and its suitability for illumination has made fluorescent light panels a popular choice for general lighting applications. However, fluorescent light may appear slightly bluish and/or may have poor color rendering characteristics. Furthermore, fluorescent light bulbs may present environmental difficulties, since they may include mercury as a component.

SUMMARY

A solid state lighting apparatus according to some embodiments includes a plurality of light emitting diodes (LEDs) including at least a first LED and a second LED. Chromaticities of the first and second LEDs are selected so that a combined light generated by a mixture of light from the pair of LEDs has about a target chromaticity. The first LED may include a first LED chip that emits light in the blue or green portions of the visible spectrum and a phosphor that emits red light in response to light emitted by the first LED chip, and the second LED may emit light having a color point that is above the planckian locus of a 1931 CIE Chromaticity diagram, and in particular may have a yellow green, greenish yellow or green hue.

The color point of the second LED may be outside a ten step Macadam ellipse from any point on the planckian locus. Thus, the color point of the second LED may appear to be non-white.

In some embodiments, the second LED may include a second LED chip that emits substantially saturated light having a dominant wavelength between about 400 nm and 465 nm.

A line segment on a 1931 CIE Chromaticity diagram between a color point of combined light emitted by the first LED and the phosphor and the color point of light emitted by the second LED may cross the planckian locus between about 2500 degrees Kelvin and 4500 degrees Kelvin.

The second LED may include a second LED chip that emits saturated light in the blue portion of the visible spectrum and may further include a second phosphor that is configured to receive light emitted by the second LED chip and to responsively emit yellow light in response thereto.

The second LED may include a second LED chip that emits substantially saturated light in the green portion of the visible spectrum having a dominant wavelength between about 500 nm and 550 nm.

In some embodiments, the second LED may include a second LED chip that emits saturated light in the blue portion of the visible spectrum and includes a second phosphor that is configured to receive light emitted by the second LED chip and to emit yellow light in response thereto. The second LED chip may have a dominant wavelength of from about 430 nm to about 470 nm, and the second phosphor may emit light having a dominant wavelength from about 550 nm to about 590 nm.

In some embodiments, the first LED chip may have a dominant wavelength in the green portion of the visible spectrum from about 500 nm to about 550 nm. Furthermore, the second LED may further include a second phosphor that emits yellow light in response to light emitted by the second LED chip.

In some embodiments, the second LED chip may have a dominant wavelength from about 440 nm to about 460 nm, and the second LED may include a second phosphor that emits light having a dominant wavelength from about 550 nm to about 590 nm in response to light emitted by the second LED chip.

A combined light emitted by the second LED chip and the second phosphor may, in an absence of any additional light, produce a sub-mixture of light having x, y color coordinates which define a point which may be within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

The solid state lighting apparatus may further include a third LED that emits light in the blue or green portion of the visible spectrum and that has a dominant wavelength that may be at least about 10 nm greater than a dominant wavelength of the first LED.

The third LED may have a dominant wavelength that may be at least about 20 nm greater than the dominant wavelength of the first LED in some embodiments.

The solid state lighting device may further include a third LED that emits light in the red portion of the visible spectrum.

The solid state lighting apparatus may further include a plurality of first LEDs and a plurality of second LEDs, wherein the first LEDs and the second LEDs are arranged on a planar substrate, and the second LEDs are interspersed among the first LEDs on the planar substrate.

The solid state lighting apparatus may further include a plurality of first LEDs and a plurality of second LEDs, wherein the first LEDs and the second LEDs are arranged in respective metameric pairs of LEDs, and light emitted by each of the respective metameric pairs of LEDs has about the target chromaticity.

The first LED chip may have a dominant wavelength from about 430 nm to about 470 nm, and the phosphor may emit light having a dominant wavelength from about 600 nm to about 630 nm in response to light emitted by the first LED chip.

An illumination module according to some embodiments includes a plurality of light emitting diodes (LEDs). The plurality of light emitting diodes may include a metameric pair of LEDs, wherein chromaticities of the LEDs of the metameric pair are selected so that a combined light generated by a mixture of light from each of the LEDs of the metameric pair comprises light having about a target chromaticity. In some embodiments, the metameric pair includes a first LED including a first LED chip that emits light in the blue portion of the visible spectrum and that includes a phosphor that emits red light in response to blue light emitted by the first LED chip, and a second LED that emits light in the green portion of the visible spectrum.

A solid state lighting apparatus according to further embodiments includes a plurality of light emitting diodes (LEDs) including at least a first LED and a second LED. A combined light generated by a mixture of light from the pair of LEDs may have about a target chromaticity. The first LED may include a first LED chip that emits light in the blue or green portions of the visible spectrum and includes a phosphor that emits red light in response to light emitted by the first LED chip a combined light of the first LED chip and the phosphor may have a first color point, the second LED emits light having a second color point, and a line segment on a 1931 CIE Chromaticity diagram between the first color point and the second color point crosses the planckian locus between about 2500 Kelvin and 4500 Kelvin.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings:

FIGS. 10A and 10B illustrate a solid state lighting apparatus according to further embodiments.

FIG. 11 is a circuit diagram illustrating interconnection of LEDs in a solid state lighting apparatus according to some embodiments.

DETAILED DESCRIPTION

Figure 1:
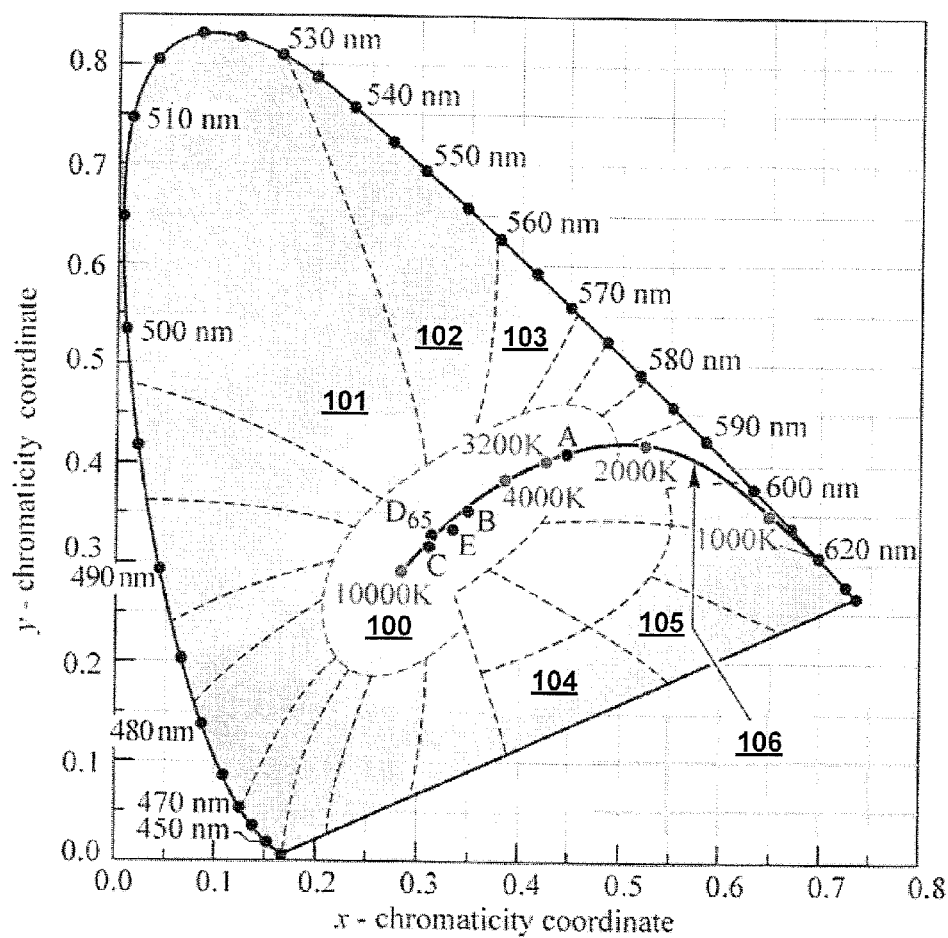
FIG. 1 is a graph of a 1931 CIE Chromaticity Diagram illustrating the location of the planckian locus.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" or "front" or "back" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Visible light may include light having many different wavelengths. The apparent color of visible light can be illustrated with reference to a two dimensional chromaticity diagram, such as the 1931 CIE Chromaticity Diagram illustrated in FIG. 1, and the 1976 CIE u'v' Chromaticity Diagram, which is similar to the 1931 Diagram but is modified such that similar distances on the 1976 u'v' CIE Chromaticity Diagram represent similar perceived differences in color. These diagrams provide useful reference for defining colors as weighted sums of colors.

In a CIE-u'v' chromaticity diagram, such as the 1976 CIE Chromaticity Diagram, chromaticity values are plotted using scaled u- and v-parameters which take into account differences in human visual perception. That is, the human visual system is more responsive to certain wavelengths than others. For example, the human visual system is more responsive to green light than red light. The 1976 CIE-u'v' Chromaticity Diagram is scaled such that the mathematical distance from one chromaticity point to another chromaticity point on the diagram is proportional to the difference in color perceived by a human observer between the two chromaticity points. A chromaticity diagram in which the mathematical distance from one chromaticity point to another chromaticity point on the diagram is proportional to the difference in color perceived by a human observer between the two chromaticity points may be referred to as a perceptual chromaticity space. In contrast, in a non-perceptual chromaticity diagram, such as the 1931 CIE Chromaticity Diagram, two colors that are not distinguishably different may be located farther apart on the graph than two colors that are distinguishably different.

As shown in FIG. 1, colors on a 1931 CIE Chromaticity Diagram are defined by x and y coordinates (i.e., chromaticity coordinates, or color points) that fall within a generally U-shaped area. Colors on or near the outside of the area are saturated colors composed of light having a single wavelength, or a very small wavelength distribution. Colors on the interior of the area are unsaturated colors that are composed of a mixture of different wavelengths. White light, which can be a mixture of many different wavelengths, is generally found near the middle of the diagram, in the region labeled 100 in FIG. 1. There are many different hues of light that may be considered "white," as evidenced by the size of the region 100. For example, some "white" light, such as light generated by sodium vapor lighting devices, may appear yellowish in color, while other "white" light, such as light generated by some fluorescent lighting devices, may appear more bluish in color.

Light that generally appears green is plotted in the regions 101, 102 and 103 that are above the white region 100, while light below the white region 100 generally appears pink, purple or magenta. For example, light plotted in regions 104 and 105 of FIG. 1 generally appears magenta (i.e., red-purple or purplish red).

It is further known that a binary combination of light from two different light sources may appear to have a different color than either of the two constituent colors. The color of the combined light may depend on the relative intensities of the two light sources. For example, light emitted by a combination of a blue source and a red source may appear purple or magenta to an observer. Similarly, light emitted by a combination of a blue source and a yellow source may appear white to an observer.

Also illustrated in FIG. 1 is the planckian locus 106, which corresponds to the location of color points of light emitted by a black-body radiator that is heated to various temperatures. In particular, FIG. 1 includes temperature listings along the black-body locus. These temperature listings show the color path of light emitted by a black-body radiator that is heated to such temperatures. As a heated object becomes incandescent, it first glows reddish, then yellowish, then white, and finally bluish, as the wavelength associated with the peak radiation of the black-body radiator becomes progressively shorter with increased temperature. Illuminants which produce light which is on or near the black-body locus can thus be described in terms of their correlated color temperature (CCT).

The chromaticity of a particular light source may be referred to as the "color point" of the source. For a white light source, the chromaticity may be referred to as the "white point" of the source. As noted above, the white point of a white light source may fall along the planckian locus. Accordingly, a white point may be identified by a correlated color temperature (CCT) of the light source. White light typically has a CCT of between about 2000 K and 8000 K. White light with a CCT of 4000 may appear yellowish in color, while light with a CCT of 8000 K may appear more bluish in color. Color coordinates that lie on or near the black-body locus at a color temperature between about 2500 K and 6000 K may yield pleasing white light to a human observer.

"White" light also includes light that is near, but not directly on the planckian locus. A Macadam ellipse can be used on a 1931 CIE Chromaticity Diagram to identify color points that are so closely related that they appear the same, or substantially similar, to a human observer. A Macadam ellipse is a closed region around a center point in a two-dimensional chromaticity space, such as the 1931 CIE Chromaticity Diagram, that encompasses all points that are visually indistinguishable from the center point. A seven-step Macadam ellipse captures points that are indistinguishable to an ordinary observer within seven standard deviations, a ten step Macadam ellipse captures points that are indistinguishable to an ordinary observer within ten standard deviations, and so on. Accordingly, light having a color point that is within about a ten step Macadam ellipse of a point on the planckian locus may be considered to have the same color as the point on the planckian locus.

The ability of a light source to accurately reproduce color in illuminated objects is typically characterized using the color rendering index (CRI). In particular, CRI is a relative measurement of how the color rendering properties of an illumination system compare to those of a black-body radiator. The CRI equals 100 if the color coordinates of a set of test colors being illuminated by the illumination system are the same as the coordinates of the same test colors being irradiated by the black-body radiator. Daylight has the highest CRI (of 100), with incandescent bulbs being relatively close (about 95), and fluorescent lighting being less accurate (70-85).

For backlight and illumination applications, it is often desirable to provide a lighting source that generates white light having a high color rendering index, so that objects illuminated by the lighting source may appear more natural. Accordingly, such lighting sources may typically include an array of solid state lighting devices including red, green and blue light emitting devices. When red, green and blue light emitting devices are energized simultaneously, the resulting combined light may appear white, or nearly white, depending on the relative intensities of the red, green and blue sources. However, even light that is a combination of red, green and blue emitters may have a low CRI, particularly if the emitters generate saturated light, because such light may lack contributions from many visible wavelengths.

Furthermore, it may increase the complexity of drive circuits of a solid state lighting device to incorporate red emitting light emitting diodes in a solid state lighting device in an effort to obtain a desired CCT. Red LEDs typically include AlInGaP active layers, which may have different thermal characteristics from other LEDs in the device, such as InGaN-based blue LEDs. To maintain a relatively constant color point in different thermal regimes, it may be beneficial to take into account these different in thermal characteristics of the light sources by altering the drive current to the LEDs, thereby increasing the complexity of the solid state lighting device.

A solid state lighting device according to some embodiments includes a plurality of light emitting diodes (LEDs) including at least a first LED and a second LED. Chromaticities of the first and second LEDs are selected so that a combined light generated by a mixture of light from the pair of LEDs has about a target chromaticity, which may for example be white. In some embodiments, the first LED includes a first LED chip that emits light in the blue portion of the visible spectrum and includes a phosphor, such as a red phosphor, that is configured to receive at least some of the light emitted by the blue LED chip and responsively emit red light. In particular embodiments, the first LED chip may have a dominant wavelength from about 430 nm to about 480 nm, and in some cases from about 450 nm to about 460 nm, and the phosphor may emit light having a dominant wavelength from about 600 nm to about 630 nm in response to light emitted by the first LED.

The second LED emits light having a color point that lies above the planckian locus of a 1931 CIE Chromaticity diagram, for example, in a green, yellowish green or green-yellow portion of the 1931 CIE Chromaticity Diagram, as explained in more detail below.

The color point of the second LED may be outside a 10-step Macadam ellipse from any point on the planckian locus. Accordingly, the light emitted by the second LED may not be generally regarded as white light, but may be more green or greenish-yellow in appearance.

In some embodiments, the second LED may include a second LED chip that emits substantially saturated light having a dominant wavelength between about 500 nm and 550 nm, i.e., a green LED. In other embodiments, the second LED may include an LED chip/phosphor combination that emits unsaturated, non-white light that is, for example, green-yellow in appearance.

In some embodiments, the second LED may include a second LED chip that emits substantially saturated light in the blue portion of the visible spectrum and may include a second phosphor that is configured to receive light emitted by the second LED chip and to emit yellow light in response the blue light emitted by the second LED chip. Accordingly, in some embodiments, both the first LED chip and the second LED chip may include blue emitting LEDs.

In still further embodiments, the first LED may include a first LED chip that emits substantially saturated light in the green portion of the visible spectrum (i.e., from about 500 nm to about 550 nm) and may include a first phosphor that is configured to receive light emitted by the first LED chip and to emit red light in response the green light emitted by the first LED chip. A combined light emitted by the first LED chip and the first phosphor may fall below the planckian locus. In some embodiments, the first LED chip may emit substantially saturated light having a dominant wavelength between about 500 nm to about 530 nm, and the first phosphor may emit light having a dominant wavelength from about 600 nm to about 630 nm in response to light emitted by the first LED.

The second LED may include a second LED chip that emits substantially saturated light in the green portion of the visible spectrum and may include a second phosphor that is configured to receive light emitted by the second LED chip and to emit yellow light in response the green light emitted by the second LED chip, wherein a combined light emitted by the second LED chip and the second phosphor has a color point above the planckian locus. Accordingly, in some embodiments, both the first LED chip and the second LED chip may include green emitting LEDs. That is, combining a green emitting LED chip with a red phosphor can result in light having a color point that falls above or below the planckian locus depending on the amount of red phosphor used. Combining a green LED with a red phosphor may have greater luminous efficacy than a combination of a blue LED with red phosphor due to reduced Stokes loss of the green to red conversion versus a blue to yellow conversion as a percentage of wavelength.

Such a device (i.e. including a first green LED combined with red phosphor and a second green LED combined with a yellow phosphor), may have high luminous efficacy, but may suffer from low CRI. As noted, the high luminous efficacy may result from lower Stokes losses.

In other embodiments, the second LED may include a second LED chip that emits substantially saturated light in the blue portion of the visible spectrum (e.g., about 430 nm to about 480 nm dominant wavelength) and includes a second phosphor that is configured to receive light emitted by the second LED chip and to emit yellow light in response the blue light emitted by the second LED chip. Accordingly, in some embodiments, the first LED may include a green emitting LED chip combined with a red phosphor while the second LED may include a blue emitting LED chip combined with a yellow phosphor. Such a device may have both excellent color rendering characteristics and good luminous efficacy.

In still further embodiments, the second LED may emit substantially saturated blue (430 nm to 480 nm dominant wavelength) and/or cyan (480 nm to 500 nm dominant wavelength) light that, when combined with light from the first LED (including a green LED combined with a red phosphor), appears white. Such a combination may generate white light having good color rendering characteristics and excellent luminous efficacy.

The first LED chip, the phosphor, and the second LED may have respective color points selected so that a line segment on the 1931 CIE Chromaticity diagram between a first color point of combined light emitted by the first LED chip and the phosphor and a second color point of light emitted by the second LED crosses the planckian locus at a point that is between about 2500 K and 4500 K. By adjusting relative intensities of the first and second LEDs, a color point near the planckian locus between about 2500 K and 4500 K may be desirably output by a combination of light from the first LED chip, the phosphor and the second LED.

Figure 2:
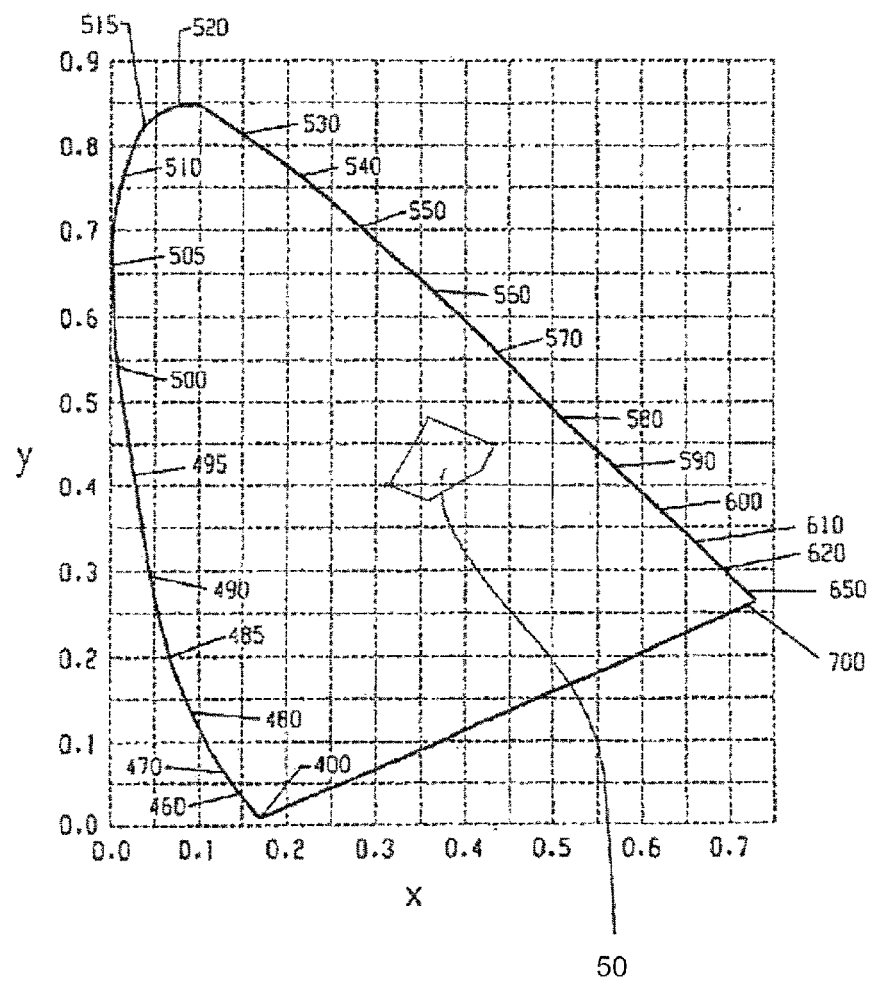
FIG. 2 is a graph of a 1931 CIE Chromaticity Diagram on which a chromaticity region above the planckian locus is illustrated.

In some embodiments, the device may include LED/phosphor combinations as described in U.S. Pat. No. 7,213,940, issued May 8, 2007, and entitled "LIGHTING DEVICE AND LIGHTING METHOD," the disclosure of which is incorporated herein by reference. As described therein, a lighting device may include solid state light emitters (i.e., LED chips) which emit light having dominant wavelength in ranges of from 430 nm to 480 nm, and a group of phosphors which emit light having dominant wavelength in the range of from 555 nm to 585 nm. A combination of light by the first group of emitters, and light emitted by the group of phosphors produces a sub-mixture of light having x, y color coordinates within a defined area on a 1931 CIE Chromaticity Diagram that is referred to herein as "blue-shifted yellow" or "BSY," illustrated as region 50 in the 1931 CIE Chromaticity Diagram shown in FIG. 2. Such non-white light may, when combined with light having a dominant wavelength from 600 nm to 630 nm, produce warm white light.

Furthermore, as described herein, BSY light may, when combined with light in the magenta to red-purple region of the 1931 CIE Chromaticity diagram, produce warm white light having high luminous efficacy and/or high CRI.

Accordingly, in some embodiments, a combined light emitted by the second LED chip and the second phosphor would, in an absence of any additional light, produce a sub-mixture of light having x, y color coordinates which define a point which may be within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

The solid state lighting device may further include a third LED chip that emits light in the blue or green portion of the visible spectrum and that has a dominant wavelength that may be at least about 10 nm greater than a dominant wavelength of the first LED chip. That is, a third LED chip may be provided that may "fill in" some of the spectral gaps that may be present in light emitted by the lighting device, to thereby improve the CRI of the device. The third LED chip may have a dominant wavelength that may be at least about 20 nm greater, and in some embodiments about 50 nm or more greater, than the dominant wavelength of the first LED chip.

Figure 3:
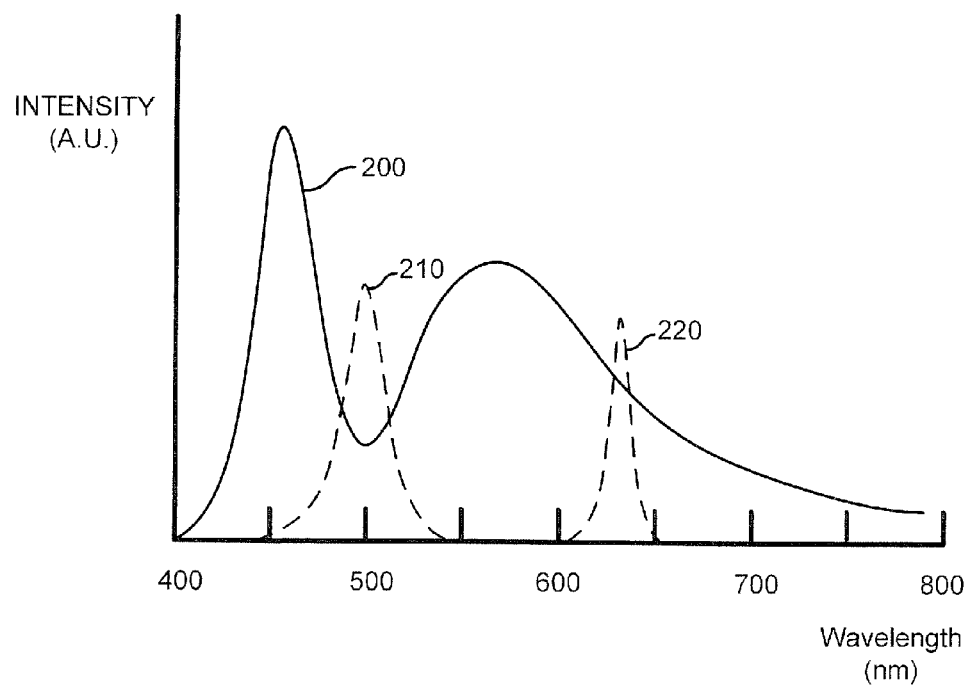
FIG. 3 is a graph of a spectral distribution of a solid state lighting device.

For example, FIG. 3 illustrates a spectrum 200 (intensity vs. wavelength) of light emitted by a blue LED chip and a yellow phosphor. The spectrum 200 includes a narrow peak at around 450 nm that represents light emitted by a blue LED chip and a broad peak centered around 550-560 nm that represents light emitted by a yellow phosphor, such as YAG:Ce, in response to light emitted by the blue LED. A green LED chip having a dominant wavelength of about 500 nm and an emission spectrum 210 may be provided in addition to the blue LED to provide additional spectral energy in the gap between the blue emission peak and the yellow emission peak.

In some further embodiments, the solid state lighting device may further include yet another LED chip that emits light in the red portion of the visible spectrum. The red LED chip may further fill in spectral gaps in the spectrum of light emitted by the device, which may further improve CRI. For example, as further shown in FIG. 3, a red LED chip having a dominant wavelength of about 630 nm and an emission spectrum 220 may provide additional spectral energy in the tail of the yellow emission peak. It will be appreciated that the spectral distributions illustrated in FIG. 3 are representative graphs for illustration only, and do not represent actual or simulated data.

Figure 4A:
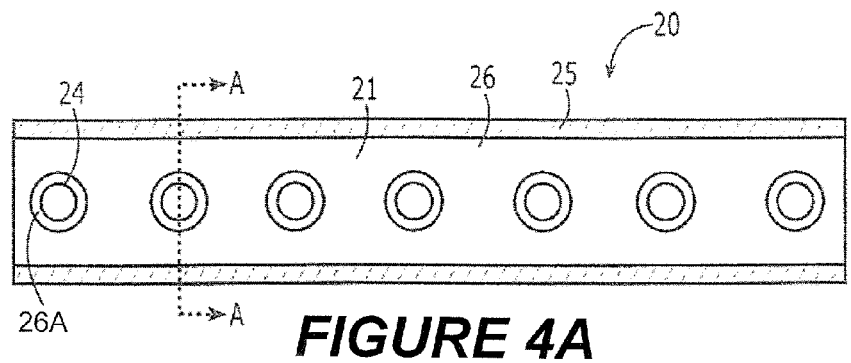
FIG. 4A is a plan view of a solid state lighting apparatus in the form of a linear illumination module according to some embodiments.

Some embodiments provide an illumination module that can achieve high color uniformity, high color rendering (CRI), improved thermal stability, and/or high luminous efficacy. FIG. 4A is a plan view of a linear illumination module 20 according to some embodiments, and FIG. 4B is a cross-sectional view of the linear illumination module 20 along line A-A of FIG. 4A.

A linear illumination module 20 according to some embodiments includes multiple surface mount technology (SMT) packaged LEDs 24 arranged in an array, such as a linear array, on a printed circuit board (PCB) 22, such as a metal core PCB (MCPCB), a standard FR-4 PCB, or a flex PCB. The LEDs 24 may include, for example, XLamp® brand packaged LEDs available from Cree, Inc., Durham, N.C. The array can also include a two-dimensional array of LEDs 24. The PCB 22 may optionally be bonded by an adhesive 19, such as double-sided PSA tape from Adhesives Research, for structural purposes and/or to provide improved thermal transfer to an underlying support member 21.

Figure 4B:
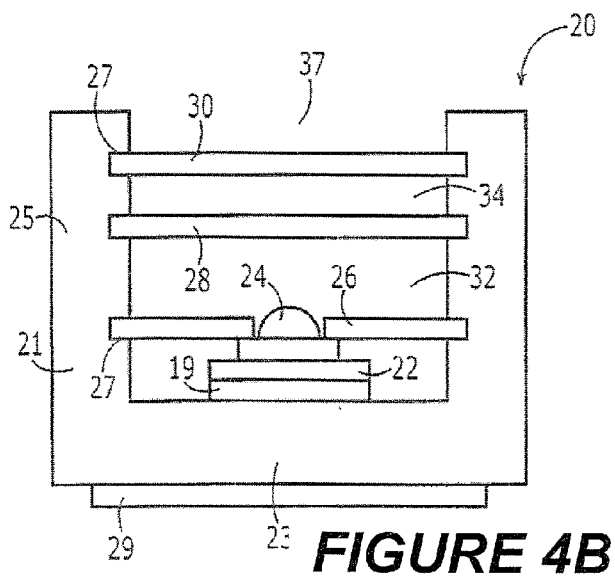
FIG. 4B is a cross-sectional view of the linear illumination module of FIG. 4A.

As shown in FIGS. 4A and 4B, the support member 21 may be a generally U-shaped metal channel, with or without additional grooves, such as an aluminum extrusion. The support member 21 may include a base portion 23 to which the PCB 22 is bonded and upwardly extending sidewalls 25 that form the generally U-shaped cross-section. The support member 21 may have supplemental holes (not shown) for registry and/or fastening the PCB 22. Such holes may be used to receive alignment pins to guide placement of the PCB 22 on the support member 21 during assembly. The support member 21 may be long enough to support multiple PCBs 22 placed end to end within the channel, and may include holes for registering the PCBs 22 in a precise fashion relative to one another. The LEDs 24 on each PCB 22 may be disposed in a regular linear array with, for example, 15 LEDs per one-foot section in some embodiments. When multiple PCBs 22 are provided upon one support member 21, the registration may be such that the regular linear array of one PCB 22 is a continuation of the regular linear array of the neighboring PCB 22. That is, in some embodiments, LEDs 24 at the respective ends of neighboring PCBs 22 may be positioned at the same distance from one another as LEDs 24 on the same PCB 22.

The base surface 23 of the support member 21, beneath the PCB, may be include an adhesive such as a double-sided PSA tape 29 to improve mechanical retention and thermal transfer to a surface it may be mounted upon.

The LEDs 24 on the PCB 22 can be wired using PCB traces 41 (See FIG. 6) in series, parallel or a combination of both. Other passive or active electronic components may be additionally mounted on the PCB 22 and connected to serve a particular function. Such components can include resistors, diodes, capacitors, transistors, thermal sensors, optical sensors, amplifiers, microprocessors, drivers, digital communication devices, RF or IR receivers or transmitters or other components, for example.

A reflective sheet 26 such as a microcellular polyethylene terephthalate (MCPET) or other white polymer sheet may be positioned over the PCB 22, with holes 26A cut and positioned so as to register the sheet 26 around the LEDs 24 and rest substantially level with, or beneath, the top most plane of the LEDs 24, but above the PCB 22. The reflective sheet 26 may be flat, as illustrated in FIG. 2A, and/or may be bent or bowed in a parabolic, circular, hyperbolic, V-shape, U-shape or other form. Auxiliary grooves 27 in the support member 21 may be employed to retain the reflective sheet 26. Pushpins, screws or other fasteners may also or alternatively be pressed through holes in the reflective sheet 26 to hold it to the PCB 22 and/or the support member 21. The reflective sheet 26 may be a highly reflective material, and may include a highly diffuse material, such as MCPET, or a highly specular material, such as an Enhanced Specular Reflector (ESR) available from 3M Corporation, for example.

The support member 21 may have an extended linear or rectangular opening 37 opposite the base portion 23, the optional adhesive tape 25 and the optional reflector sheet 26. The channel defined by the support member 21 may be about as wide in the aforementioned opening 37 as it is deep. That is, the width of the base portion 23 of the support member 21 from sidewall to sidewall may be about the same as the height of the sidewall portions 25 of the support member 21. These proportions may vary up to 3:1 or more in either direction (depth/width or width/depth) to achieve various optical effects.

The opening 37 may be covered by one or more optical sheets 28, 30 that are substantially transparent but not wholly so. The optical sheets 28, 30 may include a simple transmissive diffuser, a surface embossed holographic diffuser, a brightness enhancing film (BEF), a Fresnel lens, TIR or other grooved sheet, a dual BEF (DBEF) or other polarizing film, a micro-lens array sheet, or other optical sheet. A first film 28 may be a BEF and a second film 30 may be a flat white diffuser. In some embodiments, the BEF 28 may be disposed in a flat configuration nearest the LEDs 24 and the optional reflector sheet 26. The BEF 28 may be engaged in and supported by auxiliary slots or grooves 27 in the support member 21. The second film 30 may be a flat or bowed diffuser sheet, disposed further away from the LEDs 24 than the BEF 28 and also may be engaged in and supported by auxiliary grooves or slots 27 in the support member 21. Accordingly, the BEF 28 defines a first optical cavity 32 within which the LEDs 24 are positioned (between the LEDs 24 and the BEF 28). In some embodiments, the first optical cavity 32 can be defined by the reflective sheet 26, the BEF 28 and the sidewalls 25 of the support member. A second optical cavity 34 is defined between the BEF 28 and the diffuser sheet 30.

The inner surfaces of sidewalls 25 may be painted, coated or otherwise covered with a diffuse or specular reflective material or layer, with a high reflectance.

Some light rays emitted by the LEDs 24 may be transmitted by the BEF 28 into the second optical cavity 34. Other light rays from the LEDs 24 may be reflected by the BEF 28 back into the first optical cavity 32, where they can be further mixed/recycled for later extraction.

Reflected rays may impinge the reflective sheet 26 and scatter. Some portion of scattered rays from the reflective sheet 26 may travel second or multiple times back to the BEF 28 and eventually transmit therethrough. Transmitted light may go through the outer diffuser sheet 30 (if present) and be scattered again, but also transmitted externally. In some embodiments, an extra diffuser sheet 39 (FIG. 5) may be placed between the LEDs 24 and the BEF 28. The recycling between the BEF 28 and the transmissive diffuser sheet 39 on one hand and the LEDs 24 and the reflective sheet 26 on the other hand may serve to further integrate or mix the light from multiple LEDs 24. This can greatly increase apparent uniformity of the linear LED array 20, in terms of chromaticity, luminosity and/or spectral power distribution.

In some embodiments, the linear structure of the BEF film 28 employed is oriented perpendicular to the large axis of the linear array 20 to facilitate mixing of the light. In embodiments with particularly good recycling and mixing, alternating LEDs may be disposed having measurably or substantially different luminosity (intensity, flux), chromaticity, color temperature, color rendering index (CRI), spectral power distribution, or a combination thereof. This may be advantageous, for example, to increase overall color rendering index of the module 20 or to more completely utilize available distributions of the LEDs 24, without appreciably or unacceptably compromising apparent uniformity from module 20 to module 20 or across a module 20, as explained in more detail below.

Figure 4C:
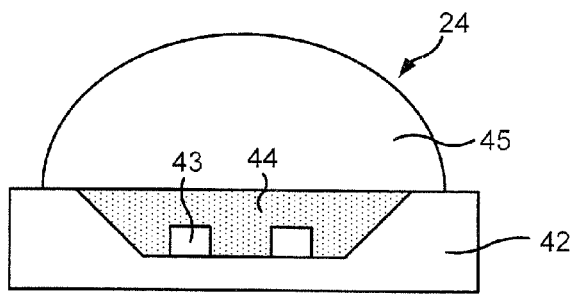
FIG. 4C is a cross-sectional view of a packaged light emitting diode according to some embodiments.

FIG. 4C is a cross-sectional view of a packaged light emitting diode 24 according to some embodiments. According to some embodiments, a packaged LED 24 includes a submount 42 on which one or more LED chips 43 are mounted. The submount 42 can include electrical traces, wirebond pads, leads, and/or other features that permit the LED chips 43 to be mounted thereon and electrically activated. The submount 42 can also include a heat sink (not shown). An optical encapsulant 44 may surround and protect the LED chips 43 within a cavity defined in, on or by the submount 42. The encapsulant material 44 may enhance coupling of light emission out of the LED chips 43 for better extraction from the package. An optional lens 45 may be mounted on the submount 42 above the LED chips 43 to provide a desired near or far field emission pattern from the package.

One or more phosphor materials can be provided within the package to convert some or all light emitted by one or more of the LED chips 43. For example, in some embodiments, a phosphor can be coated or otherwise provided on one or more of the LED chips 43, can be suspended within the encapsulant material 44, or may be coated on or mixed into the material of the lens 45. In some embodiments, a layer of phosphor bearing material can be provided between the encapsulant material 44 and the lens 45, and in some embodiments can be provided as a layer of single crystal phosphor material that is arranged to receive at least some light emitted by the LED chips 43.

Figure 5:
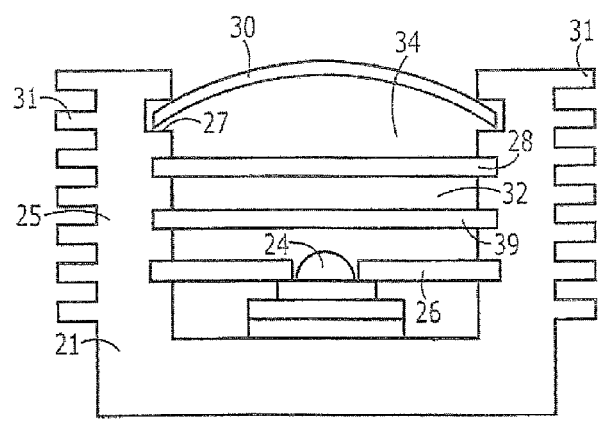
FIG. 5 is a cross sectional view of a linear illumination module according to further embodiments.

FIG. 5 is a cross sectional view of a linear illumination module 20 according to further embodiments. Referring to FIG. 5, the support member 21 may have one or more grooves or fins 31 on the outer sides of the sidewalls 25 and extending away from the sidewalls 25. The fins 31 can act as heat spreaders/radiators and/or can be provided to reduce the weight of the support member 21. The support member 21 may additionally have grooves/fins on the inside walls of the sidewalls 25 to act as heat spreaders/radiators and/or to reduce the weight of the support member 21. The support member 21 may additionally include grooves 27 on the inside walls of the sidewalls 25 that can provide mounting grooves for one or more optional optical elements, as discussed in more detail below. The grooves or fins 31 can also increase the stiffness of the module 20 without significantly increasing the weight of the module 20.

As further illustrated in FIG. 5, the outer diffuser sheet 30 may have a convex shape so that it is bowed away from the U-shaped channel of the support member 21. Furthermore, an additional diffuser sheet 39 can be provided within the first cavity 32 between the BEF 28 and the reflective sheet 26 to provide additional mixing/integration of the light emitted by the LEDs 24. A convex diffuser sheet 30 may encourage better spreading and/or more efficient extraction of light emitted by the module 20 compared to embodiments employing a flat diffuser sheet 30.

Figure 6:
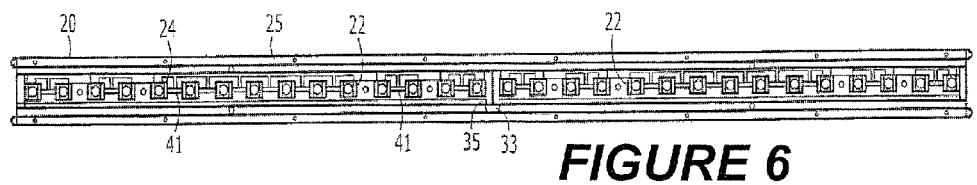
FIG. 6 is a plan view of a partially assembled linear illumination module according to some embodiments.

FIG. 6 is a plan view of a linear illumination module 20 without the BEF 28 or the diffuser sheet 30. A plurality of PCBs 22 are illustrated within the channel of a support member 21. Electrical connections 41 between adjacent LEDs 24 on a PCB 22 are illustrated, as are female electrical connectors 35 and wire jumpers 33.

Figure 7:
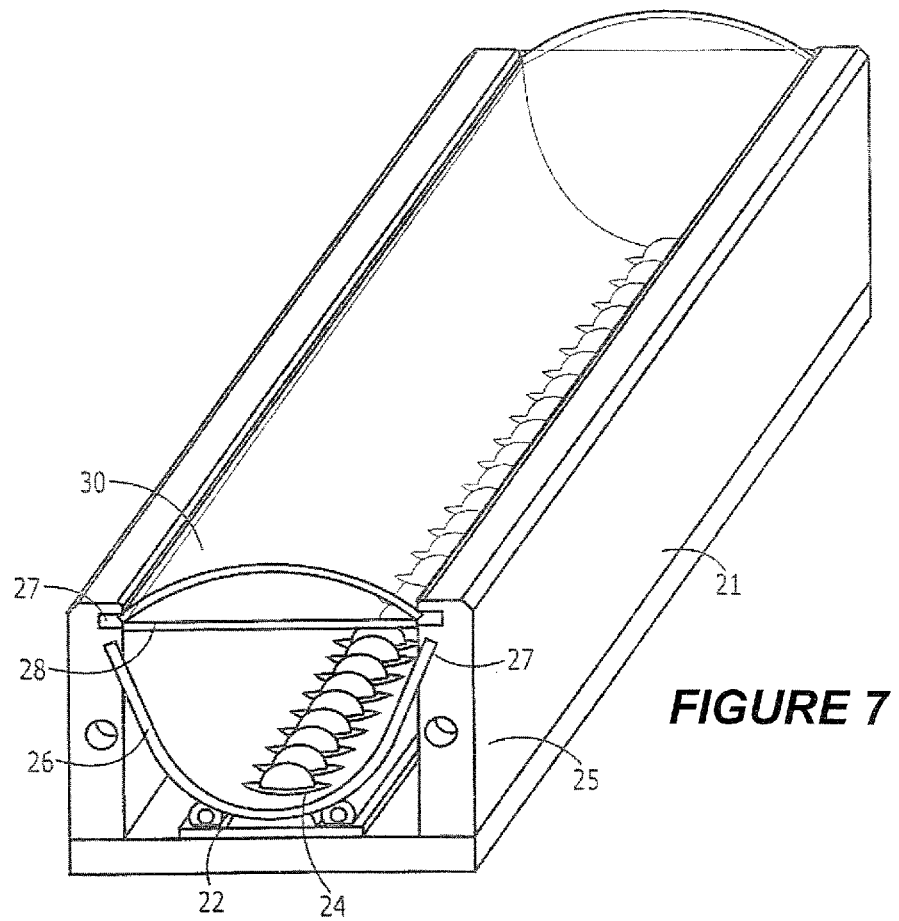
FIG. 7 is a perspective cutaway view of a linear illumination module according to some embodiments.

FIG. 7 is a perspective cutaway view of a linear illumination module 20 according to some embodiments. As shown therein, the linear illumination module 20 includes a concave reflector sheet 26 that is held in place by a pair of angled grooves 27 in the sidewalls 25 of the support member 21. As further illustrated in FIG. 5, the BEF 28 and the convex diffuser sheet 30 are held in place by a single pair of grooves 27 in the sidewalls 25 of the support member 21.

As noted above, the reflective sheet 26 may additionally or alternatively be bent or bowed in a parabolic, circular, hyperbolic, V-shape, U-shape or other form factor.

Figure 8:
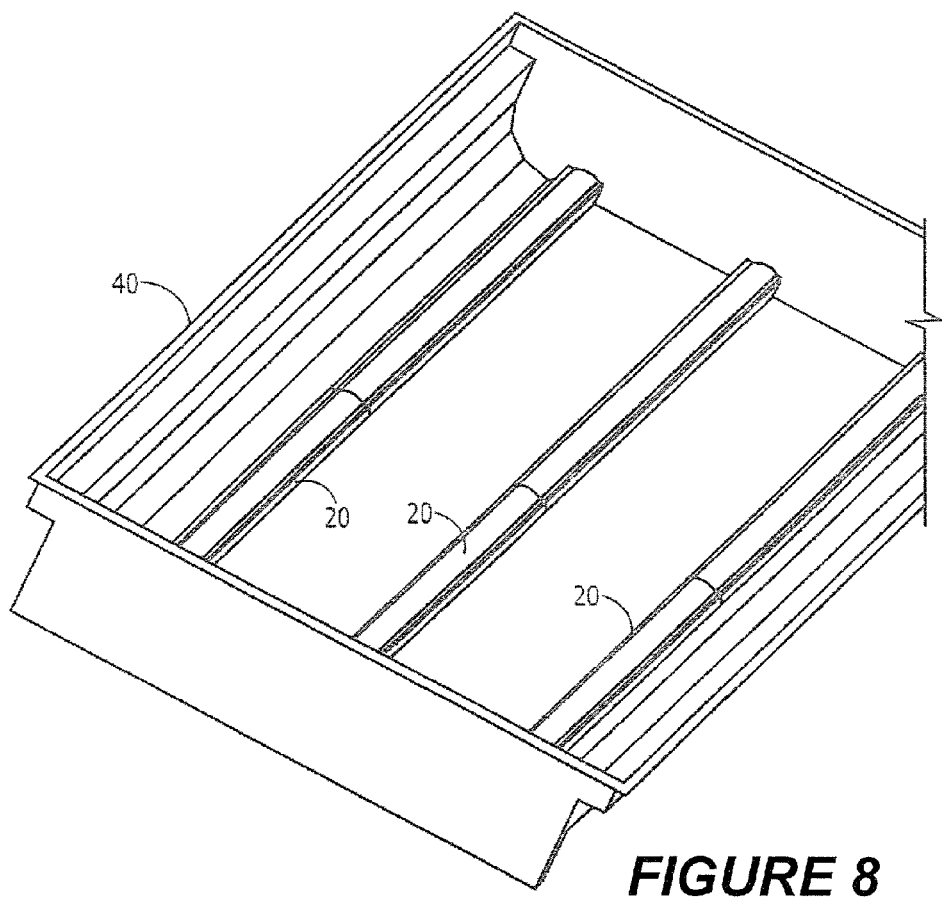
FIG. 8 is a perspective view illustrating a plurality of linear illumination modules mounted in a fixture.
Figure 9:
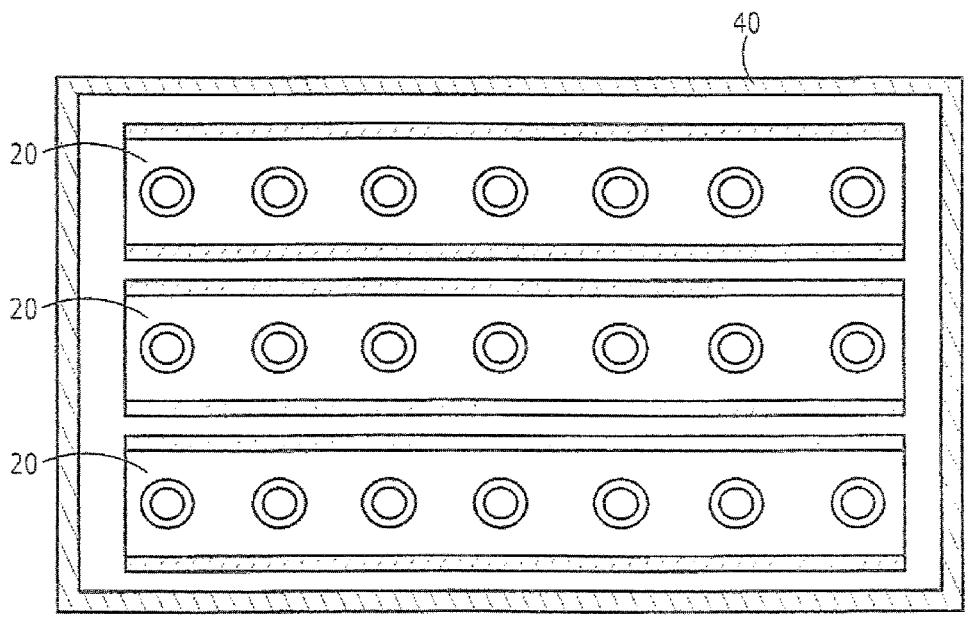
FIG. 9 is a plan view illustrating a plurality of linear illumination modules mounted in a fixture.

Referring to FIGS. 8 and 9, one or more modules 20, such as three (3) for example, may be disposed within and on a sheet metal troffer 40 or other fixture, such as a standard fluorescent tube lamp fixture. A troffer is a ceiling recess shaped like an inverted trough with its bottom positioned next to the ceiling. Troffers are conventionally used, for example, to enclose fluorescent lamps. The modules 20 may be arranged parallel to one another as illustrated in FIGS. 8 and 9, or may be arranged in other configurations.

In an alternative form, the SMT LEDs 24 may be LED chips mounted to the PCB 22 by eutectic bonding, conductive epoxy, reflow paste solder and/or adhesive. In some embodiments, these LED chips may be pre-coated with a phosphor material and pre-sorted according to color and/or luminosity. In some embodiments, the SMT LEDs 24 or LED chips may be all of a white color emitting type. In some embodiments, some of the LEDs 24 may be of a saturated color emitting type.

Referring to FIGS. 10A and 10B, a lighting apparatus 110 according to further embodiments is illustrated. The lighting apparatus 110 shown in FIGS. 10A and 10B is a "can" lighting fixture that may be suitable for use in general illumination applications as a down light or spot light. However, it will be appreciated that a lighting apparatus according to some embodiments may have a different form factor. For example, a lighting apparatus according to some embodiments can have the shape of a conventional light bulb, a pan or tray light, an automotive headlamp, or any other suitable form.

The lighting apparatus 110 generally includes a can shaped outer housing 112 in which a lighting panel 120 is arranged. In the embodiments illustrated in FIGS. 10A and 10B, the lighting panel 120 has a generally circular shape so as to fit within an interior of the cylindrical housing 112. Light is generated by solid state lighting devices (LEDs) 24A, 24B, which are mounted on the lighting panel 120, and which are arranged to emit light 115 towards a diffusing lens 114 mounted at the end of the housing 112. Diffused light 117 is emitted through the lens 114. In some embodiments, the lens 114 may not diffuse the emitted light 115, but may redirect and/or focus the emitted light 115 in a desired near-field or far-field pattern.

Still referring to FIGS. 10A and 10B, the solid-state lighting apparatus 110 may include a plurality of first LEDs 24A and a plurality of second LEDs 24B. In some embodiments, the plurality of first LEDs 24A may include white emitting, or non-white emitting, light emitting devices. The plurality of second LEDs 24B may include light emitting devices that emit light having a different dominant wavelength from the first LEDs 24A, so that combined light emitted by the first LEDs 24A and the second LEDs 24B may have a desired color and/or spectral content.

For example, the combined light emitted by the plurality of first LEDs 24A and the plurality of second LEDs 24B may be warm white light that has a high color rendering index.

Blue and/or green LED chips used in a lighting apparatus according to some embodiments may be InGaN-based blue and/or green LED chips available from Cree, Inc., the assignee of the present invention. For example, the LED chips may include EZBright® power chips manufactured by Cree, Inc. EZBright® power chips have been demonstrated with an external quantum efficiency (i.e., the product of internal quantum efficiency and light extraction efficiency) as high as 50% at 50 A/cm$^2$ corresponding to greater than 450 mW of optical output power at 350 mA drive current. Red LEDs used in the lighting apparatus may be, for example, AlInGaP LED chips available from Epistar, Osram and others.

In some embodiments, the LED chips in the LEDs 24A, 24B may have a square or rectangular periphery with an edge length of about 900 μm or greater (i.e. so-called "power chips.") However, in other embodiments, the LED chips 24A, 24B may have an edge length of 500 μm or less (i.e. so-called "small chips"). In particular, small LED chips may operate with better electrical conversion efficiency than power chips. For example, green LED chips with a maximum edge dimension less than 500 microns and as small as 260 microns, commonly have a higher electrical conversion efficiency than 900 micron chips, and are known to typically produce 55 lumens of luminous flux per Watt of dissipated electrical power and as much as 90 lumens of luminous flux per Watt of dissipated electrical power.

The LEDs 24A, 24B in the lighting apparatus 110 may be electrically interconnected in respective strings, as illustrated in the schematic circuit diagram in FIG. 11. As shown therein, the LEDs 24A, 24B may be interconnected such that the LEDs 24A are connected in series to form a first string 132A. Likewise, the LEDs 24B may be arranged in series to form a second string 132B. Each string 132A, 132B may be connected to a respective anode terminal 123A, 125A and a cathode terminal 123B, 125B.

Although two strings 132A, 132B are illustrated in FIG. 9, it will be appreciated that the lighting apparatus 110 may include more or fewer strings. Furthermore, there may be multiple strings of LEDs 24A, and multiple strings of other colored LEDs 24B.

In order to achieve warm white emission, conventional packaged LEDs include either a single component orange phosphor in combination with a blue LED chip or a mixture of yellow/green and orange/red phosphors in combination with a blue LED chip. However, using a single component orange phosphor can result in a low CRI as a result of the absence of greenish and reddish hues. On the other hand, red phosphors are typically much less efficient than yellow phosphors, and may reabsorb light emitted by the yellow phosphors. Therefore, the addition of red phosphor in yellow phosphor can reduce the efficiency of the package, which can result in poor luminous efficacy. Luminous efficacy is a measure of the proportion of the energy supplied to a lamp that is converted into light energy. It is calculated by dividing the lamp's luminous flux, measured in lumens, by the power consumption, measured in watts. Furthermore, mixing red and yellow phosphors can result in loss of efficiency, because the excitation band of the red phosphors may overlap with the emission spectrum of the yellow phosphors, which means that some light emitted by the yellow phosphors may get re-absorbed by the red phosphors.

Accordingly, in some embodiments, there may be magenta, or blue shifted red (BSR) emitting phosphor based LEDs 24A and green-yellow, BSY or green emitters 24B provided as physically separate emitters on a PCB 120. A magenta emitting phosphor based LED can include, for example, a blue LED chip coated or otherwise combined with a red phosphor. The magenta light emitted by a blue LED chip coated or otherwise combined with red phosphor can combine, for example, with green light emitted by a green LED chip or green-yellow light (e.g., Blue Shifted Yellow, or BSY) to produce warm white light having a high CRI (e.g., greater than 95) with a high luminous efficacy (lm/W). Such a combination can be particularly useful, as InGaN-based green LEDs can have relatively high efficiency. Furthermore, the human eye is most sensitive to light in the green portion of the spectrum. Thus, although some efficiency can be lost due to the use of a red phosphor, the overall efficiency of the pair of LEDs can increase due to the increased efficiency of a green LED or a BSY LED, as discussed below.

The use of magenta LEDs (e.g., blue LED chips combined with red phosphor) in combination with green LEDs to produce white light can have surprising benefits. For example, systems using such LED combinations can have improved thermal-optical stability. In contrast, systems that include InGaN-based blue LEDs and AlInGaP-based red LEDs can have problems with thermal-optical stability, since the color of light emitted by AlInGaP-based LEDs can change more rapidly with temperature than the color of light emitted by InGaN-based LEDs. Thus, LED-based lighting assemblies that include InGaN-based blue LEDs and AlInGaP-based red LEDs are often provided with active compensation circuits that change the ratio of red to blue light emitted by the assembly as the operating temperature of the assembly changes, in an attempt to provide a stable color point over a range of temperatures.

In contrast, an assembly combining blue LED chips combined with red phosphor and green or BSY LEDs can have better thermal stability, possibly without requiring color-temperature compensation, because both the blue LED chips and the green LEDs can be InGaN-based devices that have similar responses to temperature variation. In some embodiments, color-temperature compensation can be provided, but the range of the temperature-induced color sweep can be reduced, thereby reducing the needed control authority in the compensation circuit and/or providing additional degrees of design freedom with potential benefits to color tolerancing and the binning scheme for the system.

In some embodiments, the blue LED chips can be combined with both red and yellow phosphors to generate non-white light (although, as explained above, the self-absorption of yellow light by the red phosphors can reduce the efficiency of the device). The non-white light generated by such an LED chip/phosphor combination can be combined with green light emitted by an InGaN-based green LED chip to produce white light having high color rendering capabilities and improved thermal stability. The addition of yellow phosphor can improve the color rendering abilities of the device, since a yellow phosphor can produce light having a broad spectrum. Broad-spectrum light tends to provide better color rendering characteristics compared to light generated by sources having narrow emission peaks.

Providing LED devices with an efficient, saturated green emitter near 530 nm may be particularly important for LCD backlighting where the green light source can provide 50% or more of the illumination. Furthermore, a magenta/green LED combination can provide better overall system efficiency than a system that uses unsaturated light from fluorescent lamps (CCFL) or greenish white fluorescent LEDs. A pure green LED of equal efficiency at the same dominant wavelength as a greenish white LED can provide substantially greater front of screen (FOS) luminance than the greenish white LED because the illumination may pass through the filters much more efficiently.

Figure 12:
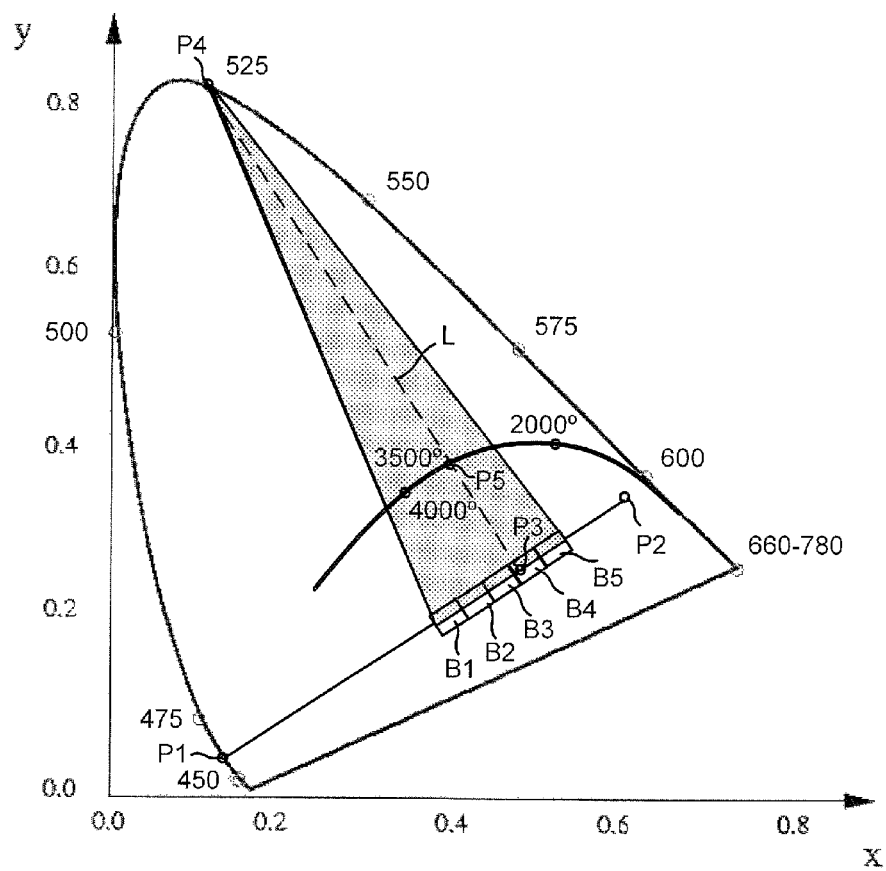
FIG. 12 is a 1931 CIE Chromaticity Diagram that illustrates combinations of LEDs in a lighting apparatus according to some embodiments.

FIG. 12, which is a 1931 CIE Chromaticity Diagram, illustrates the combination of magenta and green LEDs in a lighting device. As illustrated therein, a first LED is provided that emits light at a color point P1 having a dominant wavelength of about 400 nm to about 470 nm, in some embodiments about 450 nm to about 465 nm and in some embodiments about 460 nm. A red phosphor is configured to receive at least some light emitted by the blue LED and to responsively emit light at a color point P2 having a dominant wavelength of about 600 nm to about 630 nm. A combined light emitted by the blue LED and the red phosphor may have a color point P3 that falls into one of the bins B1-B5 illustrated in FIG. 12. The bins B1-B5 may be centered around respective color points that are separated from adjacent points by at least a seven step Macadam ellipse, and in some cases by at least a 10 step Macadam ellipse.

Suitable red phosphors include $CaAlSiN^3:Eu^{2+}$ and $Sr_2Si_5N_8:Eu^{2+}$. This phosphor can maintain a quantum efficiency greater than 80% at temperatures above 150° C. Other red phosphors that can be used include phosphors from the $Eu^{2+}$—SiAlON family of phosphors, as well as $CaSiN_2:Ce^{3+}$, $CaSiN_2:Eu^{2+}$ and/or phosphors from the $(Ca,Si,Ba)SiO_4$: $Eu^{2+}$ (BOSE) family. In particular, $CaAlSiN:Eu^{2+}$ phosphors available from Mitsubishi Chemical Company may have a dominant wavelength of about 624 nm, a peak wavelength of about 628 nm and a FWHM of about 100 nm.

Nitride phosphors are characterized by a broad excitation band. Overlap between the excitation band of one phosphor in a system and the emission spectrum of another phosphor in the system can result in photon re-absorption in systems that use mixed red/yellow phosphors, for example. In particular, most red nitride phosphors have an excitation bands that extend well over 500 nm. The re-absorption that can occur when mixing yellow-green and red phosphors can lead to significant losses, especially if the conversion efficiency of the phosphors is below 90%.

Accordingly, some embodiments employ multiple color phosphor conversion LEDs using temperature stable phosphors. A typical approach for generating warm white light is to combine red direct emission LEDs with a phosphor conversion yellow-green LED. The drawback of this approach is the temperature sensitivity of the red direct emission (i.e. non-phosphor based) LEDs, which requires complex drive circuitry to monitor and balance the output power of the red LED as the system heats up. Typical temperature operating levels necessary to generate the appropriate radiant flux for general illumination run at a junction temperature of 125° C. or greater. At these temperatures, another drawback, other than the decreased efficacy, is the large a large drift in CCT values of the light. The instability of the red LED or YAG phosphor leads to nearly a 400K CCT shift from room temperature to operating temperatures. Some embodiments that do not include direct (i.e. non phosphor based) emission of red light can avoid some or all of these problems.

The bins B1-B5 may fall in a region such as the red-purple or purplish red regions 104, 105 illustrated in FIG. 1. Light in such bins that is generated by a combination of blue LED and red phosphor is referred to herein generally as blue shifted red, or BSR, light.

In addition to the blue LED/red phosphor combination, a green LED having a color point P4 is provided. The color point P4 may be above the planckian locus and may be associated with substantially saturated light having a wavelength in the range of about 500 nm to about 550 nm, and in particular about 525 nm. The BSR light in bins B1-B5 is combined with the green light to produce white light having a color point P4 at a CCT between about 2000 K and 6000 K, and in particular between about 2500 K to about 4500 K. Thus, a line segment L on a 1931 CIE Chromaticity diagram between a color point P3 of combined light emitted by the first LED and the phosphor and the color point P4 of light emitted by the second LED may cross the planckian locus between about 2500 Kelvin and 4500 Kelvin.

Figure 13:
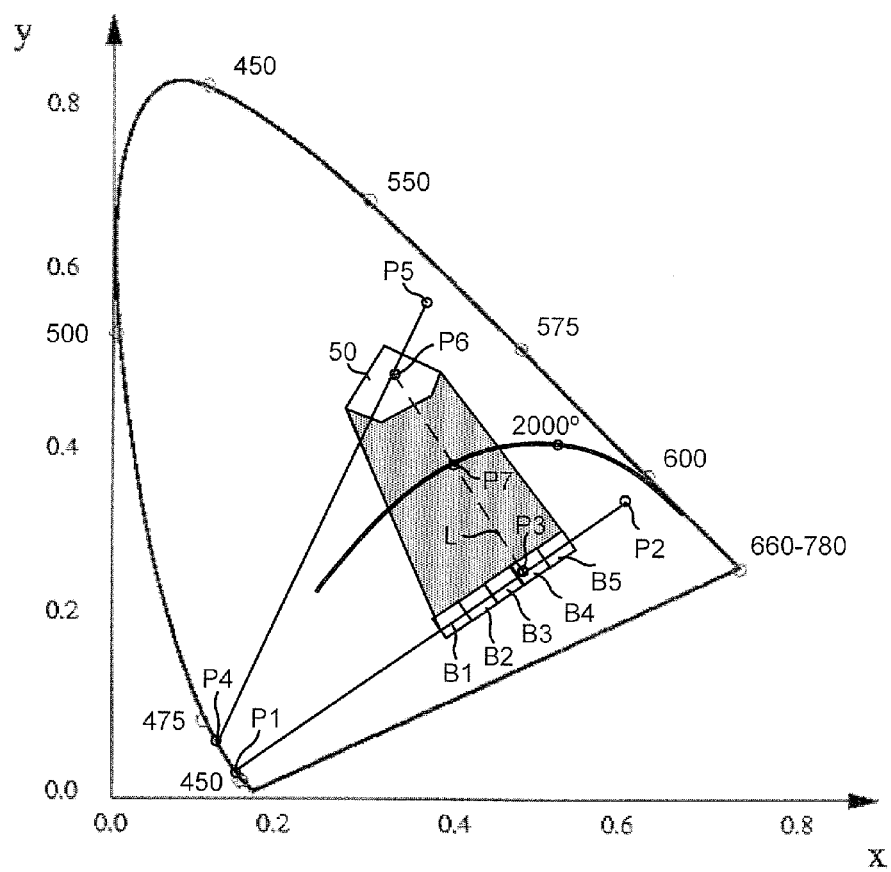
FIG. 13 is a 1931 CIE Chromaticity Diagram that illustrates combinations of LEDs in a lighting apparatus according to further embodiments.

FIG. 13 is a 1931 CIE Chromaticity Diagram that illustrates the combination of magenta and BSY LEDs in a lighting device. As illustrated therein, a first LED is provided that emits light at a color point P1 having a dominant wavelength of about 400 nm to about 470 nm, in some embodiments about 450 nm to about 465 nm, and in some embodiments about 450 nm. A red phosphor is configured to receive at least some light emitted by the blue LED and to responsively emit light at a color point P2 having a dominant wavelength of about 600 nm to about 630 nm. A combined light emitted by the blue LED and the red phosphor may comprise BSR light having a color point P3 that falls into one of the bins B1-B5 illustrated in FIG. 13. The bins B1-B5 may fall in a region such as the red-purple or purplish red regions 104, 105 illustrated in FIG. 1.

In addition to the blue LED/red phosphor combination, a BSY LED having a color point P6 within region 50 is provided. The color point P6 may therefore fall above the planckian locus. The BSR light may be generated by providing a blue LED having a dominant wavelength at a color point P4 of about 430 nm to 480 nm, in some embodiments about 450-465 nm, and in some embodiments about 460 nm in combination with a yellow-emitting phosphor that emits light at a color point P5 to produce the BSY light. Suitable yellow phosphors include $Y_3Al_5O_{12}:Ce^{3+}$(Ce:YAG), $CaAlSiN_3$:$Ce^{3+}$, and phosphors from the $Eu^{2+}$—SiAlON-family, and/or the BOSE family. The phosphor may also be doped at any suitable level to provide a desired wavelength of light output. In some embodiments, Ce and/or Eu may be doped into a phosphor at a dopant concentration in a range of about 0.1% to about 20%. Suitable phosphors are available from numerous suppliers, including Mitsubishi Chemical Corporation, Tokyo, Japan, Leuchtstoffwerk Breitungen GmbH, Breitungen, Germany, and Intematix Company, Fremont, Calif.

The BSR light in bins B1-B5 is combined with the BSY light to produce white light having a color point P7 at a CCT between about 2000 K and 6000 K, and in particular between about 2500 K to about 4500 K. Thus, a line segment L on a 1931 CIE Chromaticity diagram between a color point P3 of combined light emitted by the first LED and the red phosphor and the color point P6 of light emitted by the second LED and the yellow phosphor the may cross the planckian locus between about 2500 Kelvin and 4500 Kelvin.

Although the color points P1 and P3 are illustrated in FIG. 13 as being at different locations, it will be appreciated that the color points P1 and P3 may be at the same location, i.e., the blue LEDs that are used to generate BSR light may have the same dominant wavelength as the blue LEDs that are used to generate BSY light.

The use of separate blue LEDs to generate both BSR and BSY light may provide certain advantages, in that the phosphors that are used to generate BSR light and BSY light may be separated from one another, so that light emitted by one phosphor is not substantially reabsorbed by another phosphor (i.e., any incidental absorption that may occur may be insubstantial). For example, light generated by the yellow phosphor in the BSY LED may fall within the excitation region of the red phosphor used to generate the BSR light. Thus, some of the yellow light that constitutes the BSY light may be undesirably reabsorbed if the phosphors were combined on the same emitter.

Figure 14:
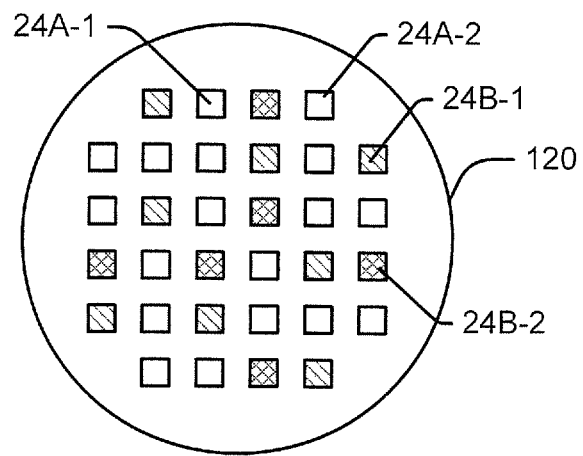
FIG. 14 illustrates portions of a solid state lighting apparatus according to further embodiments.

A single lighting device may include LEDs from multiple BSR bins and/or multiple BSY bins. For example, referring to FIG. 14, a single lighting device may include a plurality of first BSR LEDs 24A-1 and second BSR LEDs 24A-2, and/or a plurality of first BSY LEDs 24B-1 and second BSY LEDs 24B-2. The first BSR LEDs 24A-1 may fall within a first bin of the BSR bins B1 to B5, while the second BSR LEDs 24A-2 may fall within a second bin of the BSR bins B1 to B5 that is different from the first bin. Similarly, the first BSY LEDs 24B-1 may fall within a first portion of the BSY region 50 (FIG. 13), while the second BSY LEDs 24B-2 may fall within a second portion of the BSY region 50 that is different from the first portion. The first and second portions of the BSY region 50 may be distinguished in that they may be centered around color points that are at separated by at least a seven step Macadam ellipse, and in some cases by at least a ten step Macadam ellipse. The bins B1-B5 may be selected or defined such that a line segment between any point in the bins B1-B5 and any point in the BSY region 50 may cross the planckian locus at a point that is between about 2500 K and 6000 K.

Accordingly, a lighting apparatus according to some embodiments may include first and second BSR LEDs that emit perceptibly different colors of light and/or first and second BSY LEDs that emit perceptibly different colors of light. Light from the first and second BSR LEDs and the first and second BSY LEDs may combine to generate warm white light having a CCT between about 2000 K and 6000 K, and in particular between about 2500 K to about 4500 K.

In some embodiments, brighter and dimmer LEDs 24A, 24B may be alternated in the linear array. For embodiments of some types, the LEDs 24A, 24B may be wired in two or more groups with independent current control or duty cycle control. The result will generally be a uniform high-efficiency light emitting diode illumination module 20.

As discussed previously, one of the significant challenges with mass production of illumination assemblies in which multiple LEDs 24 are employed is potential nonuniformity of color and/or luminosity arising from variations in the chromaticity and intensity/flux of the LED devices employed, and/or variations in the fluorescent media used for color conversion, if employed.

In order to contend with such non-uniformities, it is typical to 100% measure, sort and physically group (i.e. bin) the LED devices prior to their placement in a luminaire assembly or a multi-LED subassembly. However, this approach can present a serious logistics problem if the device-to-device variation in color and/or luminosity is large, as is often the case. In this case, the problem arising is that while physical sorting and grouping the devices into assembly may manage uniformity well for individual assemblies, there may still be in large differences from assembly to assembly. If multiple assemblies are used in an installation (such as multiple light fixtures in the ceiling of an office), the difference from assembly to assembly can become very obvious and objectionable. A common solution to this is for an assembly company making luminaires to purchase and utilize only a fraction of the LED device population after they are binned. In this fashion, all the fixtures made of by that company should come out appearing similar. But this poses yet another challenge, namely, what is to be done with all the other LED devices sorted and grouped but not purchased for making fixtures. Accordingly, some embodiments can address this problem, thereby potentially achieving simultaneously high uniformity within an assembly, high similarity from assembly to assembly, and/or elevated utilization of the production distribution of the LED devices.

Figure 15:
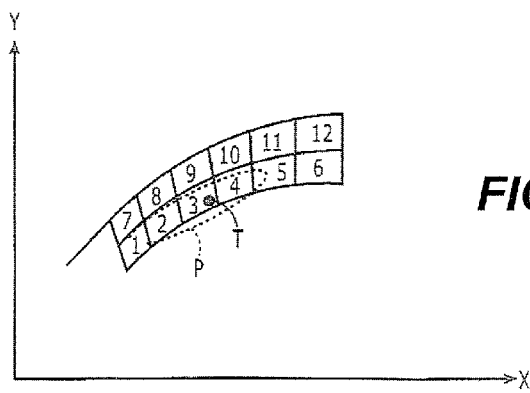
FIG. 15 illustrates a portion of a two-dimensional chromaticity space including bin locations and a production locus.

As an example, consider the binning system for white LEDs illustrated in FIG. 15, which is a portion of a 1931 CIE chromaticity diagram. As shown therein, a particular production system produces LEDs having a chromaticity falling within a production locus P. The locus P represents the variation boundaries in two-dimensional chromaticity space for the distribution of a production recipe, for example. The two-dimensional chromaticity space may, for example, be the 1931 CIE chromaticity space. The numbered polygons 1-12 illustrated in FIG. 15 are chromaticity bins. As each member of the LED production population is tested, the chromaticity of the LED is determined, and the LED is placed in an appropriate bin. Those members of the population having the same bin associations may be sorted and grouped together. It is common for a luminaire manufacturer to use members from one of these bins to make assemblies to assure uniformity within a multi-LED assembly and similarity between all such assemblies. However, much of the locus P would be left unused in such a situation.

Some embodiments provide enhanced mixing of light (by use of the recycling cavities 32, 34 bounded by reflective and other optical sheets, diffusers, BEFs, etc.) into which light from the LEDs 24 is injected. Some embodiments can also employ alternate binary additive color mixing to achieve metameric equivalent assemblies. "Binary additive color mixing" means the use of two light sources (e.g. LED devices) of a known different chromaticity within an optical homogenizing cavity to combine the two illuminations, such that a desired third apparent color is created. The third apparent color can result from a variety of alternate binary combinations that may all be the same in two-dimensional chromaticity space (i.e. metameric equivalents).

Referring still to FIG. 15, a production population chromaticity locus P is shown as at least partially covering five bin groups 1-5.

Figure 16:
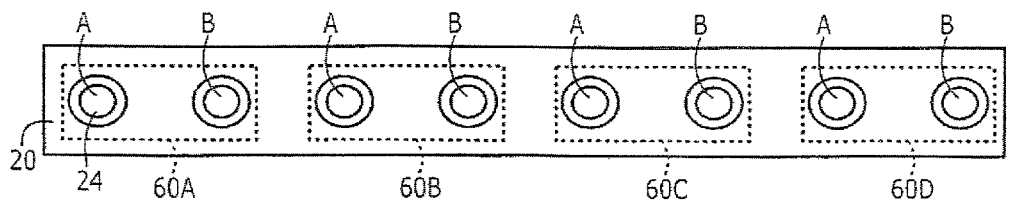
FIG. 16 illustrates placement of various type of LEDs on a linear illumination module according to some embodiments.

Referring to FIG. 16, a linear illumination module 20 is shown including a plurality of LED devices 24 for use in illumination assembly. The module 20 includes at least one homogenizing cavity 32, 34 (FIG. 4B). As shown in FIG. 16, two alternating groups of LED devices are labeled a group A and group B. The LED devices 24 are grouped into groupings 60, referred to herein as metameric groupings 60A-60D. Chromaticities of the LEDs 24 of the metameric groupings 60A-60D are selected so that a combined light generated by a mixture of light from each of the LEDs 24 of the metameric groupings 60A-60D may include light having about a target chromaticity T. Two points in a two-dimensional chromaticity space are considered to have about the same chromaticity if one point is within a seven step Macadam ellipse of the other point, or vice versa. A Macadam ellipse is a closed region around a center point in a two-dimensional chromaticity space, such as the 1931 CIE chromaticity space, that encompasses all points that are visually indistinguishable from the center point. A seven-step Macadam ellipse captures points that are indistinguishable to an ordinary observer within seven standard deviations.

A two-dimensional chromaticity space may include a 1931 CIE chromaticity space or a 1976 CIE chromaticity space.

Figure 17:
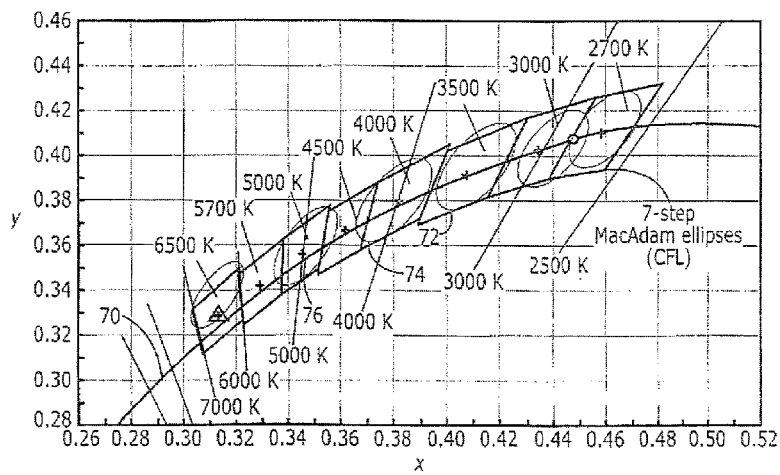
FIG. 17 illustrates a portion of a two-dimensional chromaticity space including the black-body radiation curve and correlated color temperature (CCT) quadrangles of light generally considered white.

In some embodiments, the chromaticity of each of the LEDs 24 of a metameric groupings 60A-60D may be within about a seven step Macadam ellipse about a point on a black-body radiation curve on a 1931 CIE chromaticity space from a correlated color temperature (CCT) of 4000K to 8000K. Thus, each of the LEDs 24 may individually have a chromaticity that is within a region that is generally considered to be white. For example, FIG. 12 illustrates a portion of a 1931 CIE diagram including the black-body radiation curve 70 and a plurality of CCT quadrangles, or bins, 72. Furthermore, FIG. 17 illustrates a plurality of 7-step Macadam ellipses 74 around various points 76 on or near the black-body radiation curve 70.

However, in some embodiments, one or more of the LEDs 24 of a metameric grouping 60A-60D may have a chromaticity that is outside a seven step Macadam ellipse about a point on a black-body radiation curve on a 1931 CIE chromaticity space from a correlated color temperature of 4000K to 8000K, and thus may not be considered white to an observer.

Thus, to achieve a desired series of illuminator assemblies with such a linear module 20 with the series having substantially equal apparent chromaticity at the target point T, each assembly thus providing a metameric equivalent of chromaticity T, the following three alternate pairs of A/B binary additive combinations may be used:
A and B are from Bin three.
A and B are from Bins two and four, respectively.
A and B are from Bins one and five, respectively.

Accordingly, an adjacent pair of devices A and B in the module 20 may be selected based on their actual chromaticity points being about equidistant from the target chromaticity point T, or being in bins that are about equidistant from the bin in which the target chromaticity point T is located.

By considering the effects of luminosity in additive color mixing, some embodiments provide additional binary pairs effective to create the same metameric equivalent target T chromaticity assembly. A luminosity (luminous intensity, luminous flux, etc.) ranking system of three ascending ranges of luminosity can be defined, for example, as:
Af: 85 to 90 lumens
Bf: 90 to 95 lumens
Cf: 95 to 100 lumens
Then, additional allowable pairs for the previous example may include:
A and B are Bin two, Rank Cf, and Bin five Rank Af, respectively
A and B are Bin four, Rank Cf and Bin one, Rank Af, respectively
A and B are Bin three, Rank Af and Bin three, Rank Cf, respectively Thus, each of the LEDs 24 of each metameric grouping 60A-60D may have a luminosity that is generally inversely proportional to a distance of a chromaticity of the LED 24 to the target chromaticity T in a two-dimensional chromaticity space.

Accordingly, an adjacent group of devices A and B in the module 20 may be selected to provide a desired light output. In a binary system, for example, where a first device of the pair of devices is closer to the target chromaticity point T, the first device may have a higher brightness than the second device of the pair of devices. Likewise, where a first device of the pair of devices is farther form the target chromaticity point T, the first device may have a lower brightness than the second device of the pair of devices. Where the devices are in chromaticity bins that are about equidistant from the target chromaticity point, the devices may have about the same brightness. Thus, in some embodiments, each of the LEDs 24 of a metameric grouping 60A-60D may have about the same luminosity and may have a chromaticity that is about the same distance from the target chromaticity T in two dimensional chromaticity space.

By using an effective homogenizer, using alternate mixing to achieve equivalent metameric targets from a multitude of bin groupings and/or an alternating LED device layout of the linear module 20, it may be possible to utilize a large proportion of distribution locus P while still achieving a product distribution with good uniformity within each luminaire assembly and/or good similar similarity among a produced series of luminaire assemblies. The better the recycling homogenizing effect, the greater differences between devices that constitute a metameric grouping are allowable without impacting uniformity.

Although binary groupings are illustrated in FIG. 15, it will be appreciated that ternary, quaternary and higher-order versions may also be utilized, in which a metameric grouping includes three or more LED devices.

Furthermore, by providing groupings which, when driven with substantially the same current are utilized to provide the desired target chromaticity, the LEDs may be driven a single string of LEDs. Accordingly, the drive circuitry for driving the LEDs may be simplified over multiple string approaches, such as RGB approaches, that use current to control the intensity of the LEDs and thereby control the resultant chromaticity of the combined output. Such a resultant target chromaticity may be the overall target chromaticity of the overall lighting device or may be the target chromaticity for a component, such as a desired BSY or BSR color point, of the lighting device. Thus, a combination of LEDs that provide a target chromaticity may be provided in a single string whereas the overall output of the lighting device may be provided by multiple strings of such groups of LEDs.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A solid state lighting apparatus comprising:
   a plurality of light emitting diodes (LEDs) including at least a first LED and a second LED, wherein a combined light generated by a mixture of light from the pair of LEDs has about a target chromaticity,
   wherein the first LED includes a first LED chip that emits light in the blue or green portions of the visible spectrum and includes a phosphor that emits red light in response to light emitted by the first LED chip, and the second LED emits light having a color point that is above the planckian locus of a 1931 CIE Chromaticity diagram,
   wherein the second LED includes a second LED chip that emits light in the blue portion of the visible spectrum and includes a second phosphor that is configured to emit yellow light in response to the light emitted by the second LED chip, and
   wherein the first LED emits light that is a combination of the blue or green portions of the visible spectrum from the first LED chip and the red light emitted by the phosphor.

2. The solid state lighting apparatus of claim 1, wherein the color point of the second LED is outside a ten step Macadam ellipse from any point on the planckian locus.

3. The solid state lighting apparatus of claim 1, wherein a line segment on a 1931 CIE Chromaticity diagram between a color point of combined light emitted by the first LED and the phosphor and the color point of light emitted by the second LED crosses the planckian locus between about 2500 Kelvin and 4500 Kelvin.

4. The solid state lighting device of claim 1, wherein the second LED includes a second LED chip that emits substantially saturated light having a dominant wavelength between about 500 nm and 550 nm.

5. The solid state lighting apparatus of claim 1, wherein the second LED chip has a dominant wavelength of from about 430 nm to about 470 nm, and wherein the second phosphor emits light having a dominant wavelength from about 550 nm to about 590 nm.

6. The solid state lighting apparatus of claim 1, wherein combined light emitted by the second LED chip and the second phosphor would, in an absence of any additional light, produce a sub-mixture of light having x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

7. The solid state lighting apparatus of claim 1, wherein the first LED chip has a dominant wavelength from about 500 nm to about 550 nm.

8. The solid state lighting apparatus of claim 7, wherein the second LED chip has a dominant wavelength from about 500 nm to about 550 nm, wherein the phosphor comprises a first phosphor, and wherein the second LED further comprises a second phosphor that emits yellow light in response to light emitted by the second LED chip.

9. The solid state lighting apparatus of claim 1, wherein the first LED chip has a dominant wavelength from about 500 nm to about 550 nm.

10. The solid state lighting apparatus of claim 1, wherein the first LED chip has a dominant wavelength from about 440 nm to about 460 nm, and wherein the phosphor emits light having a dominant wavelength from about 600 nm to about 630 nm in response to light emitted by the first LED chip.

11. The solid state lighting apparatus of claim 10, wherein the second LED chip has a dominant wavelength from about 440 nm to about 460 nm, and wherein the second LED comprises a second phosphor that emits light having a dominant wavelength from about 550 nm to about 590 nm in response to light emitted by the second LED chip.

12. The solid state lighting apparatus of claim 1, further comprising a third LED that emits light in the blue or green portion of the visible spectrum and that has a dominant wavelength that is at least about 10 nm greater than a dominant wavelength of the first LED.

13. The solid state lighting apparatus of claim 12, wherein the third LED has a dominant wavelength that is at least about 20 nm greater than the dominant wavelength of the first LED.

14. The solid state lighting apparatus of claim 1, further comprising a third LED that emits light in the red portion of the visible spectrum.

15. The solid state lighting apparatus of claim 1, further comprising a plurality of first LEDs and a plurality of second LEDs, wherein the first LEDs and the second LEDs are arranged in respective metameric pairs of LEDs, and wherein light emitted by each of the respective metameric pairs of LEDs has about the target chromaticity.

16. A solid state lighting apparatus comprising:
    a plurality of light emitting diodes (LEDs),
    wherein chromaticities of the LEDs are selected so that a combined light generated by a mixture of light emitted of the LEDs has about a target chromaticity,
    wherein the plurality of LEDs comprises a first LED including a first LED chip that emits light in the blue portion of the visible spectrum and a first phosphor that emits red light in response to blue light emitted by the first LED chip, and
    a second LED including a second LED chip that emits light in the blue portion of the visible spectrum and that includes a second phosphor that emits yellow light in response to light emitted by the second LED chip wherein a combined light emitted by the second LED chip and the second phosphor falls outside a 10-step Macadam ellipse about a point on the planckian locus on a 1931 CIE Chromaticity diagram.

17. The solid state lighting apparatus of claim 16, wherein the first LED and the second LED are arranged in the solid state lighting device as a metameric pair.

18. The solid state lighting apparatus of claim 16, wherein the target chromaticity falls within a ten step Macadam ellipse of a point on the planckian locus of a 1931 CIE diagram.

19. The solid state lighting apparatus of claim 16, wherein the second LED comprises a second LED chip that emits saturated light in the blue portion of the visible spectrum and a second phosphor that emits yellow light in response to blue light emitted by the second LED chip, and wherein the combined light emitted by the second LED chip and the second phosphor would, in an absence of any additional light, produce a sub-mixture of light having x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

20. The solid state lighting apparatus of claim 16, wherein the combined light emitted by the first LED chip and the first phosphor would, in an absence of any additional light, produce a sub-mixture of light having x, y color coordinates which define a point which is within purplish red or red-purple region on a 1931 CIE Chromaticity Diagram.

21. The solid state lighting apparatus of claim 16, wherein a line segment on a 1931 CIE Chromaticity diagram between a color point of combined light emitted by the first LED chip and the phosphor and the color point of light emitted by the second LED crosses the planckian locus between about 2500 Kelvin and 4500 Kelvin.

22. The solid state lighting apparatus of claim 16, wherein the first LED chip has a dominant wavelength from about 440 nm to about 460 nm, and wherein the phosphor emits light having a dominant wavelength from about 600 nm to about 630 nm in response to light emitted by the first LED chip.

23. An illumination module, comprising:
a plurality of light emitting diodes (LEDs) including a metameric pair of LEDs, wherein chromaticities of the LEDs of the metameric pair are selected so that a combined light generated by a mixture of light from each of the LEDs of the metameric pair comprises light having about a target chromaticity, the metameric pair comprising a first LED including a first LED chip that emits light in the blue portion of the visible spectrum and a phosphor that emits red light in response to blue light emitted by the first LED chip, and a second LED that emits non-white light that in the absence of other light appears green, yellowish-green or yellow-green,
wherein the second LED comprises a second LED chip that emits blue light and a phosphor that emits yellow light in response to the blue light emitted by the second LED chip.

24. A solid state lighting apparatus comprising:
a plurality of light emitting diodes (LEDs) including at least a first LED and a second LED;
wherein a combined light generated by a mixture of light from the pair of LEDs has about a target chromaticity;
wherein the first LED includes a first LED chip that emits light in the blue or green portions of the visible spectrum and includes a phosphor that emits red light in response to light emitted by the first LED chip,
wherein the first LED emits light that is a combination of the blue or green portions of the visible spectrum from the first LED chip and the red light emitted by the phosphor,
wherein the combined light of the first LED chip and the phosphor has a first color point,
wherein the second LED emits light having a second color point; and
wherein a line segment on a 1931 CIE Chromaticity diagram between the first color point and the second color point crosses the planckian locus between about 2500 Kelvin and 4500 Kelvin.

25. The solid state lighting apparatus of claim 24, wherein the second LED chip has a dominant wavelength of from about 430 nm to about 500 nm.

26. The solid state lighting apparatus of claim 25, wherein the second LED chip has a dominant wavelength of from about 480 nm to about 500 nm.

27. The solid state lighting apparatus of claim 26, wherein the second LED chip has a dominant wavelength of from about 490 nm to about 500 nm.

28. The solid state lighting apparatus of claim 24, wherein the color point of the second LED is outside a ten step Macadam ellipse from any point on the planckian locus.

\* \* \* \* \*

UNITED STATES PATENT AND TRADEMARK OFFICE
CERTIFICATE OF CORRECTION

| | | |
|---|---|---|
| PATENT NO. | : 8,998,444 B2 | Page 1 of 1 |
| APPLICATION NO. | : 12/491654 | |
| DATED | : April 7, 2015 | |
| INVENTOR(S) | : Roberts et al. | |

It is certified that error appears in the above-identified patent and that said Letters Patent is hereby corrected as shown below:

On Title Page:
Page 2, Item (56), Column 2, References Cited, U.S. PATENT DOCUMENTS:

Please correct "7,262,439 B2 8/2007 Radkov"
        to read -- 7,262,439 B2 8/2007 Setlur et al. --

Signed and Sealed this
Third Day of November, 2015

Michelle K. Lee
*Director of the United States Patent and Trademark Office*